US012625164B2

(12) United States Patent
Lou et al.

(10) Patent No.: US 12,625,164 B2
(45) Date of Patent: May 12, 2026

(54) PROBE DEVICE, PROBE SYSTEM INCLUDING THE PROBE DEVICE AND OPERATING METHOD THEREOF

(71) Applicant: STAR TECHNOLOGIES, INC., Hsinchu City (TW)

(72) Inventors: Choon Leong Lou, Hsinchu City (TW); Ho-Yeh Chen, Hsinchu City (TW); Hsiao-Hui Hsieh, Hsinchu City (TW); Dai-Chun Chen, Hsinchu City (TW)

(73) Assignee: STAR TECHNOLOGIES, INC., Hsinchu City (TW)

( * ) Notice: Subject to any disclaimer, the term of this patent is extended or adjusted under 35 U.S.C. 154(b) by 407 days.

(21) Appl. No.: 18/326,515

(22) Filed: May 31, 2023

(65) Prior Publication Data

US 2023/0400480 A1     Dec. 14, 2023

Related U.S. Application Data

(60) Provisional application No. 63/350,616, filed on Jun. 9, 2022.

(51) Int. Cl.
*G01R 1/073* (2006.01)
*G01R 1/02* (2006.01)
*G01R 1/04* (2006.01)
*G01R 1/067* (2006.01)
*G01R 1/20* (2006.01)
*G01R 31/28* (2006.01)

(52) U.S. Cl.
CPC ..... *G01R 1/07321* (2013.01); *G01R 1/06727* (2013.01); *G01R 1/06738* (2013.01)

(58) Field of Classification Search
CPC . G01R 1/02; G01R 1/04; G01R 1/067; G01R 1/073; G01R 1/20; G01R 31/28
See application file for complete search history.

(56) References Cited

U.S. PATENT DOCUMENTS

2021/0096176 A1*    4/2021    Frankel ................ G01R 31/311

* cited by examiner

*Primary Examiner* — Neel D Shah
(74) *Attorney, Agent, or Firm* — MUNCY, GEISSLER, OLDS & LOWE, P.C.

(57) ABSTRACT

The present disclosure provides a probe device, a probe system including the probe device and an operating thereof. The operating method includes: approaching the probe device to a reference region; stopping the probe device when a first pin of a sensing module of the probe device touches the reference region; rotating the probe device and approaching the probe device to the reference region; and stopping the probe device when both the first pin and a second pin of the sensing module of the probe device touch the reference region.

9 Claims, 48 Drawing Sheets

131

135

13

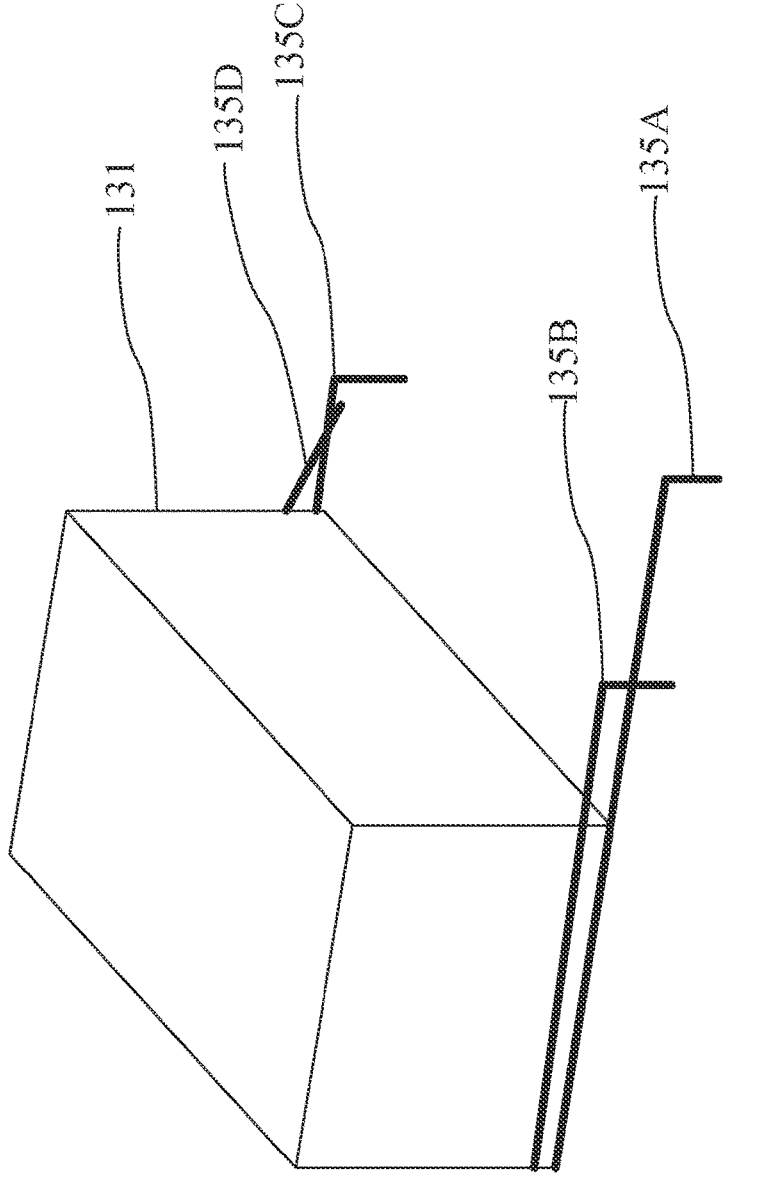
FIG. 1M

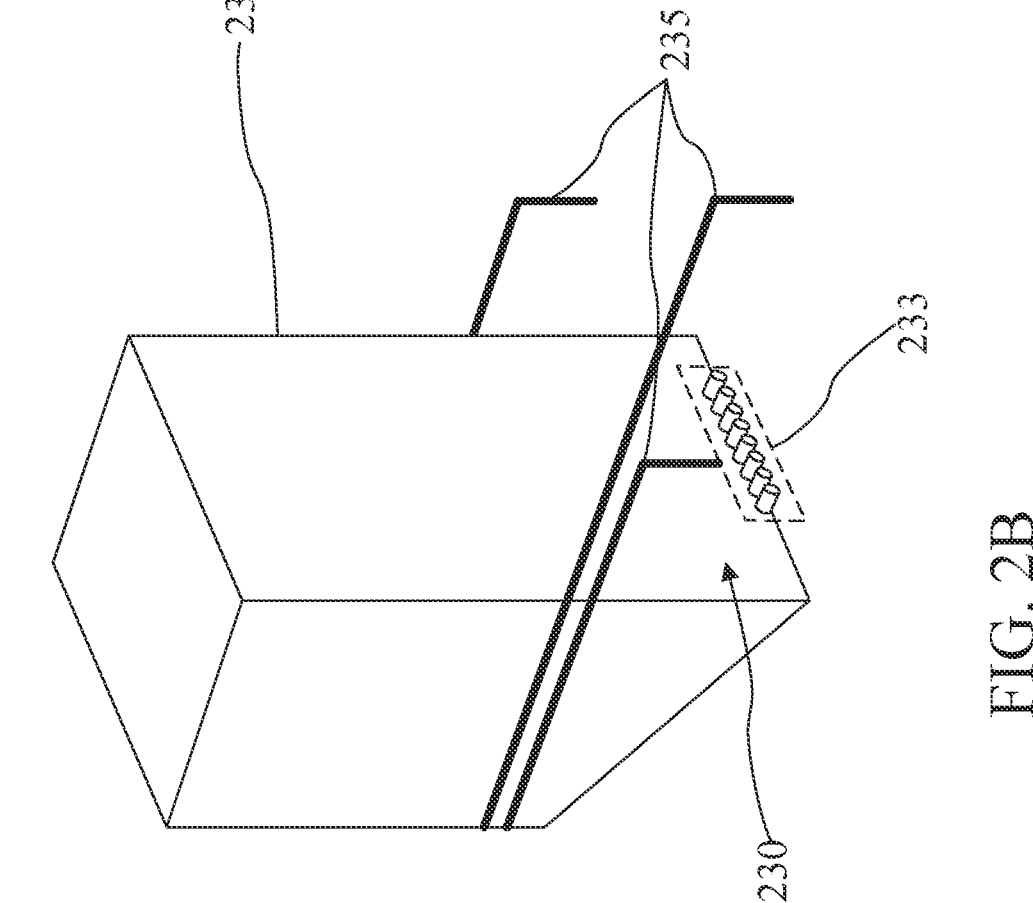
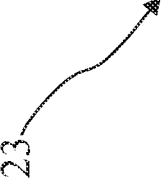
FIG. 2B

331

337

335

33

333

31

3

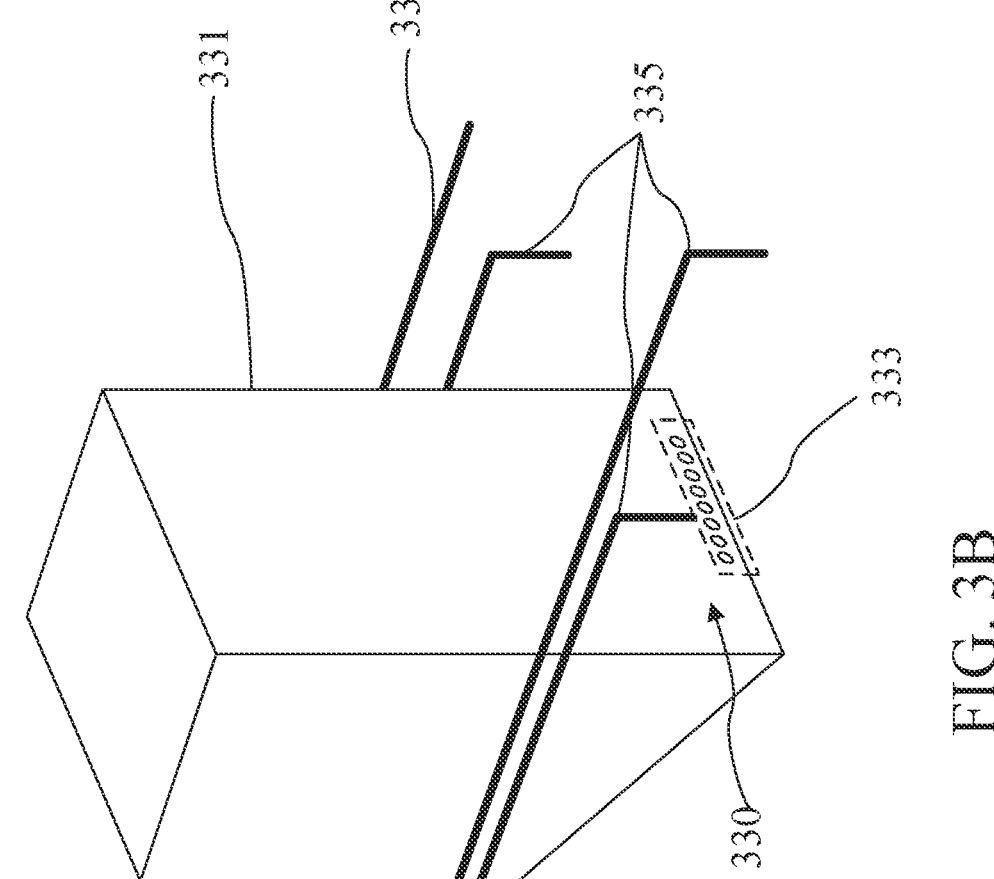
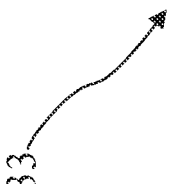
FIG. 3B

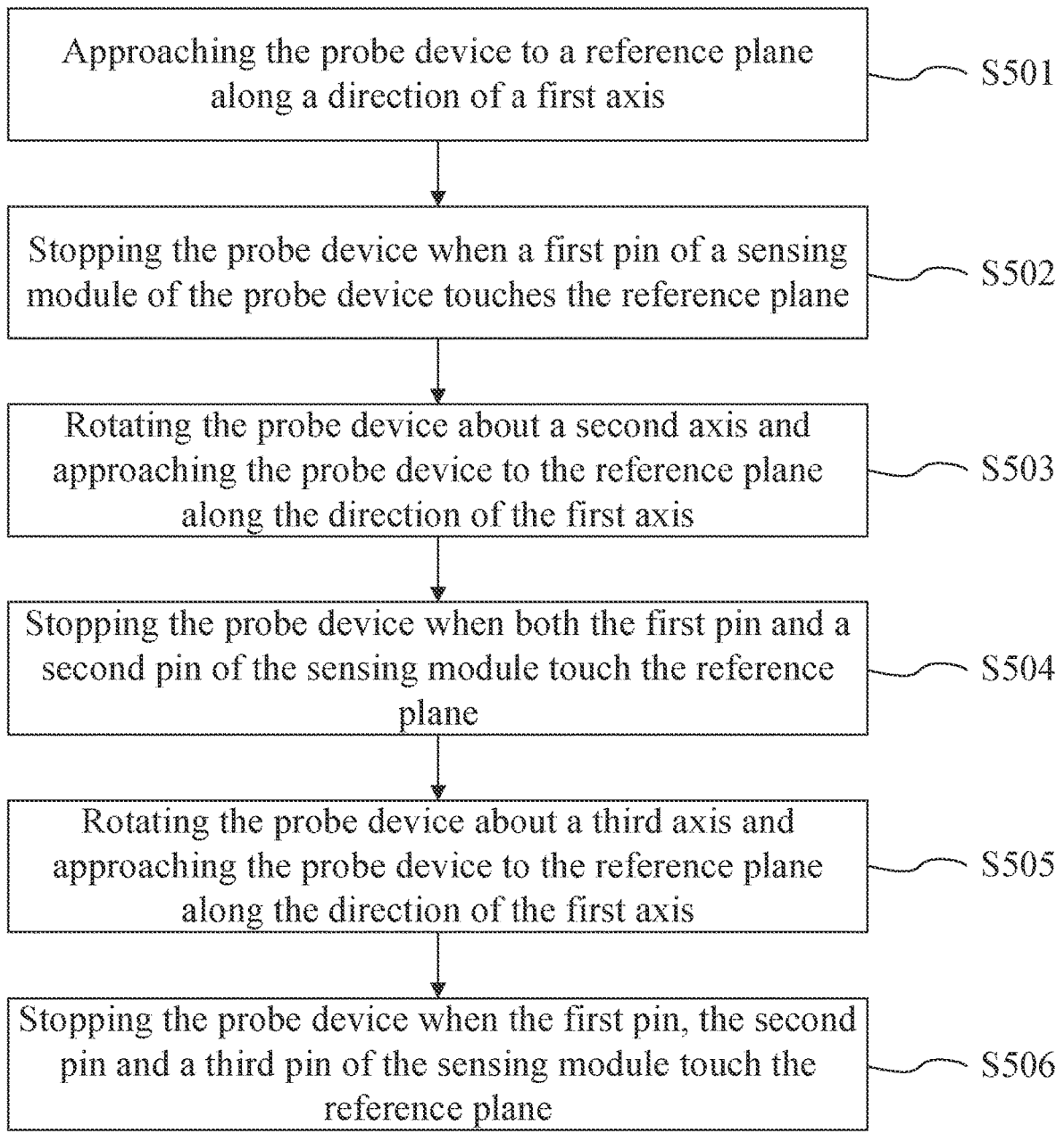

Approaching the probe device to a reference plane along a direction of a first axis — S501

Stopping the probe device when a first pin of a sensing module of the probe device touches the reference plane — S502

Rotating the probe device about a second axis and approaching the probe device to the reference plane along the direction of the first axis — S503

Stopping the probe device when both the first pin and a second pin of the sensing module touch the reference plane — S504

Rotating the probe device about a third axis and approaching the probe device to the reference plane along the direction of the first axis — S505

Stopping the probe device when the first pin, the second pin and a third pin of the sensing module touch the reference plane — S506

FIG. 5A

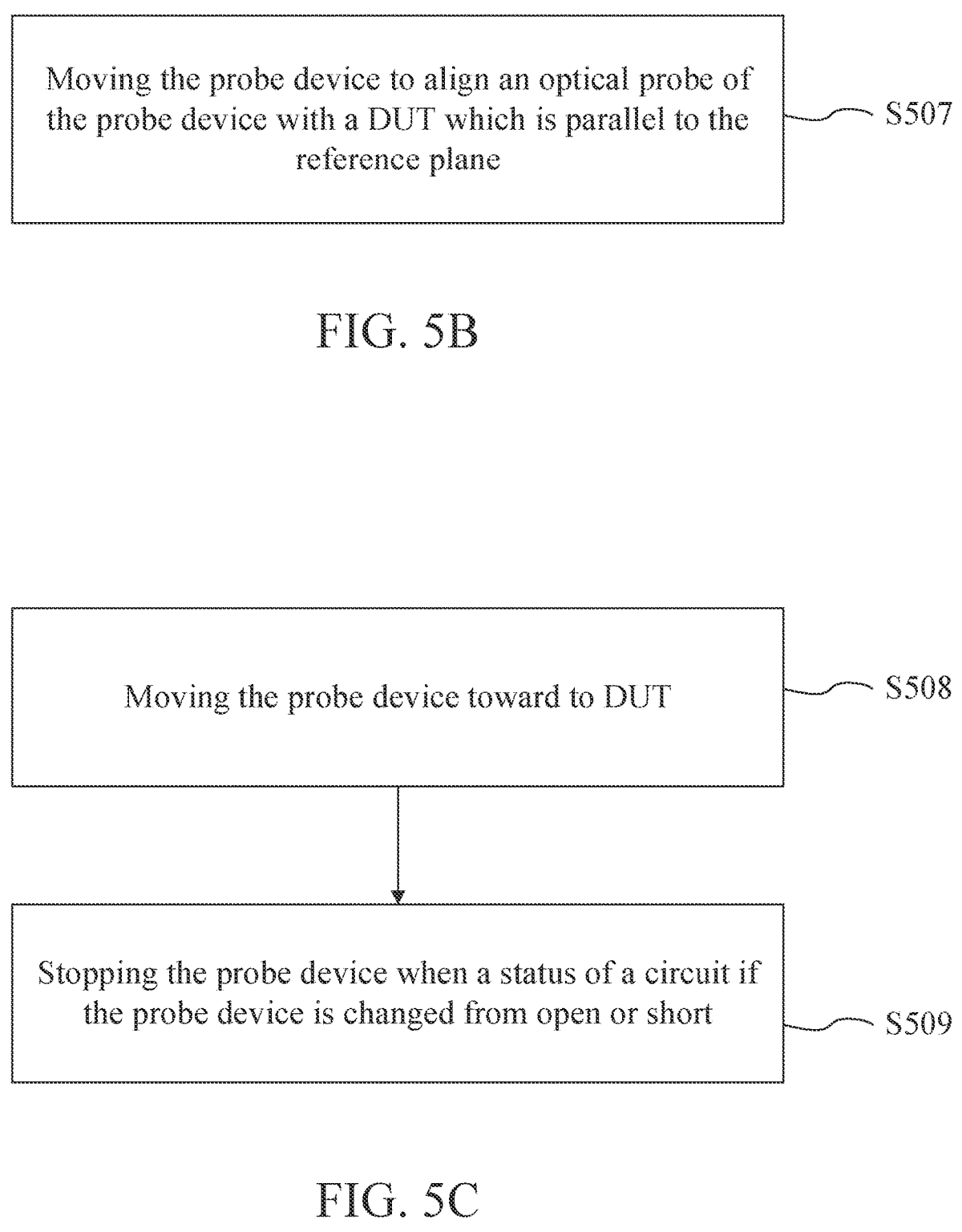

Moving the probe device to align an optical probe of the probe device with a DUT which is parallel to the reference plane     —— S507

FIG. 5B

Moving the probe device toward to DUT     —— S508

Stopping the probe device when a status of a circuit if the probe device is changed from open or short     —— S509

FIG. 5C

PROBE DEVICE, PROBE SYSTEM INCLUDING THE PROBE DEVICE AND OPERATING METHOD THEREOF

CROSS REFERENCE TO RELATED APPLICATION

This application claims priority of U.S. provisional application No. 63/350,616 filed on Jun. 9, 2022, which is incorporated by reference in its entirety.

TECHNICAL FIELD

The present disclosure relates to a probe device, a probe system including the probe device and operating method thereof and, more particularly, to a probe device with optical probe, a probe system including the probe device and operating method of aligning the optical probe to a device under test.

DISCUSSION OF THE BACKGROUND

According to prior art, optical probes receive lights from light transmission devices of a device under test (DUT) to fulfill specific testing purposes. Before receiving lights from light transmission devices of the DUT, the optical probes need to be aligned to light transmission devices of the DUT. However, the alignment between the optical probes and the light transmission devices is usually operated manually so that controlling the precision of the alignment is difficult and the results of testing are inaccurate.

The above description of the prior art merely serves to reveal background technology but is not intended to acknowledge that the above description of the prior art discloses the subject matters of the disclosure, is intended to constitute the prior art of the disclosure, or is intended to be any part of the disclosure.

SUMMARY

An embodiment of the disclosure provides a method for operating a probe device. The method includes: approaching the probe device to a reference region; stopping the probe device when a first pin of a sensing module of the probe device touches the reference region; rotating the probe device and approaching the probe device to the reference region; stopping the probe device when both the first pin and a second pin of the sensing module of the probe device touch the reference region; rotating the probe device about a second axis and approaching the probe device to the reference region; and stopping the probe device when the first pin, the second pin and a third pin of the sensing module of the probe device touch the reference region.

Another embodiment of the disclosure provides a probe device. The probe device includes a body, an optical probe and a sensing module. The optical probe is disposed on the body. The sensing module is disposed on the body and includes at least a first pin, a second pin, and a third pin to adjust two relative orientations between the optical probe and a reference region. The first pin and the second pin are configured to adjust a first relative orientation of the two relative orientations. The second pin and the third pin are configured to adjust a second relative orientation of the two relative orientations.

Another embodiment of the disclosure provides a probe system. The probe system includes a frame, a probe device and a sensing module. The frame and the probe device are assembled. The probe device includes a body and an optical probe. The optical probe is disposed on the body. The sensing module is disposed on the body or the frame and includes at least a first pin, a second pin, and a third pin to adjust two relative orientations between the optical probe and a reference region. The first pin and the second pin are configured to adjust a first relative orientation of the two relative orientations. The second pin and the third pin are configured to adjust a second relative orientation of the two relative orientations.

The above description extensively explains the technical features and advantages of the disclosure to render the detailed description below comprehensible. The other advantages and technical features which define the claims of the disclosure are described below. Persons skilled in the art understand that objectives identical to the ones of the disclosure can be easily achieved by changing or designing the other structures or processes in accordance with concepts and specific embodiments disclosed hereunder. Persons skilled in the art also understand that the aforesaid equivalent construction cannot depart from the spirit and scope of the appended claims of the disclosure.

BRIEF DESCRIPTION OF THE DRAWINGS

Persons skilled in the art can gain insight into the disclosure by referring to the embodiments, claims and drawings of the disclosure. In the drawings, like components are denoted by like reference numerals.

FIG. 1I illustrates the relative movement between the probe device and a DUT according to some embodiments of the disclosure.

FIGS. 1M and 1N are schematic views of a probe device according to some embodiments of the disclosure.

FIG. 2B is a schematic view of a probe device according to some embodiments of the disclosure.

FIGS. 2I and 2J illustrate the relative movement between the probe device and a DUT according to some embodiments of the disclosure.

FIG. 3B is a schematic view of a probe device according to some embodiments of the disclosure.

FIG. 3O illustrates adjustment of the relative position between the optical probe and the DUT according to some embodiments of the disclosure.

FIGS. 5A to 5C are flowchart diagrams of a method for operating a probe device according to some embodiments of the disclosure.

DETAILED DESCRIPTION

Figure 1A:
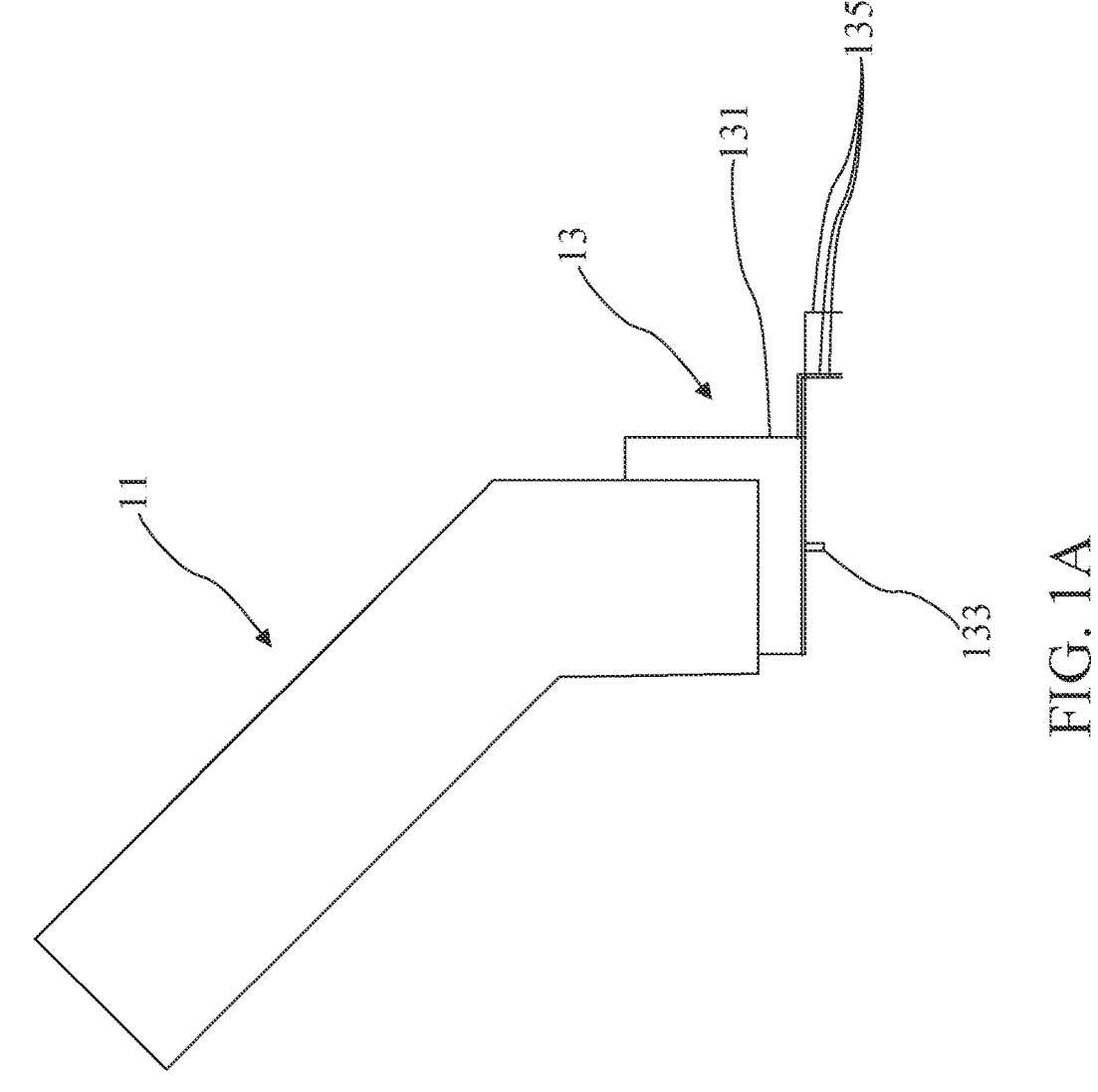
FIG. 1A is a schematic view of a probe system according to some embodiments of the disclosure.

The following description of the present disclosure is accompanied by figures that are incorporated into and constitute a part of the specification to illustrate embodiments of the present disclosure, but the present disclosure is not limited to the embodiments. In addition, the following embodiments can be appropriately integrated to complete another embodiment.

Terms such as "one embodiment," "embodiment," "exemplary embodiment," "other embodiments," "another embodiment," etc. indicate that the embodiments described in this disclosure may include specific features, structures or characteristics. However, not every embodiment has to include the specific features, structures or characteristics. Furthermore, repeated use of the term "in an embodiment" does not necessarily refer to a same embodiment, although it may.

In order to make the present disclosure fully understandable, the following description provides detailed steps and structures. Obviously, specific details known to those skilled in the art are not limited by implementation of the present disclosure. In addition, known structures and steps will not be described in detail, so as not to unnecessarily limit the present disclosure. Preferred embodiments of the present disclosure are described in detail as follows. However, in addition to detailed descriptions, the present disclosure can also be widely implemented in other embodiments. The scope of this disclosure is not limited to the content of the detailed description, but is defined by the appended claims.

It should be realized that the following disclosure provides many different embodiments, or examples, for implementing different features of the provided subject matter. Specific examples of components and arrangements are described below to simplify the present disclosure. These are, of course, merely examples and are not intended to be limiting. For example, sizes of elements are not limited to the disclosed range or value, but may depend on process conditions and/or desired properties of a device. In addition, formation of a first feature over or on a second feature in the description that follows may include embodiments in which the first and second features are formed in direct contact, and may also include embodiments in which additional features may be formed between the first and second features, such that the first and second features may not be in direct contact. For sake of brevity and clarity, dimensions of the various features may be arbitrarily increased or reduced. In the figures, some layers or features may be omitted for simplicity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
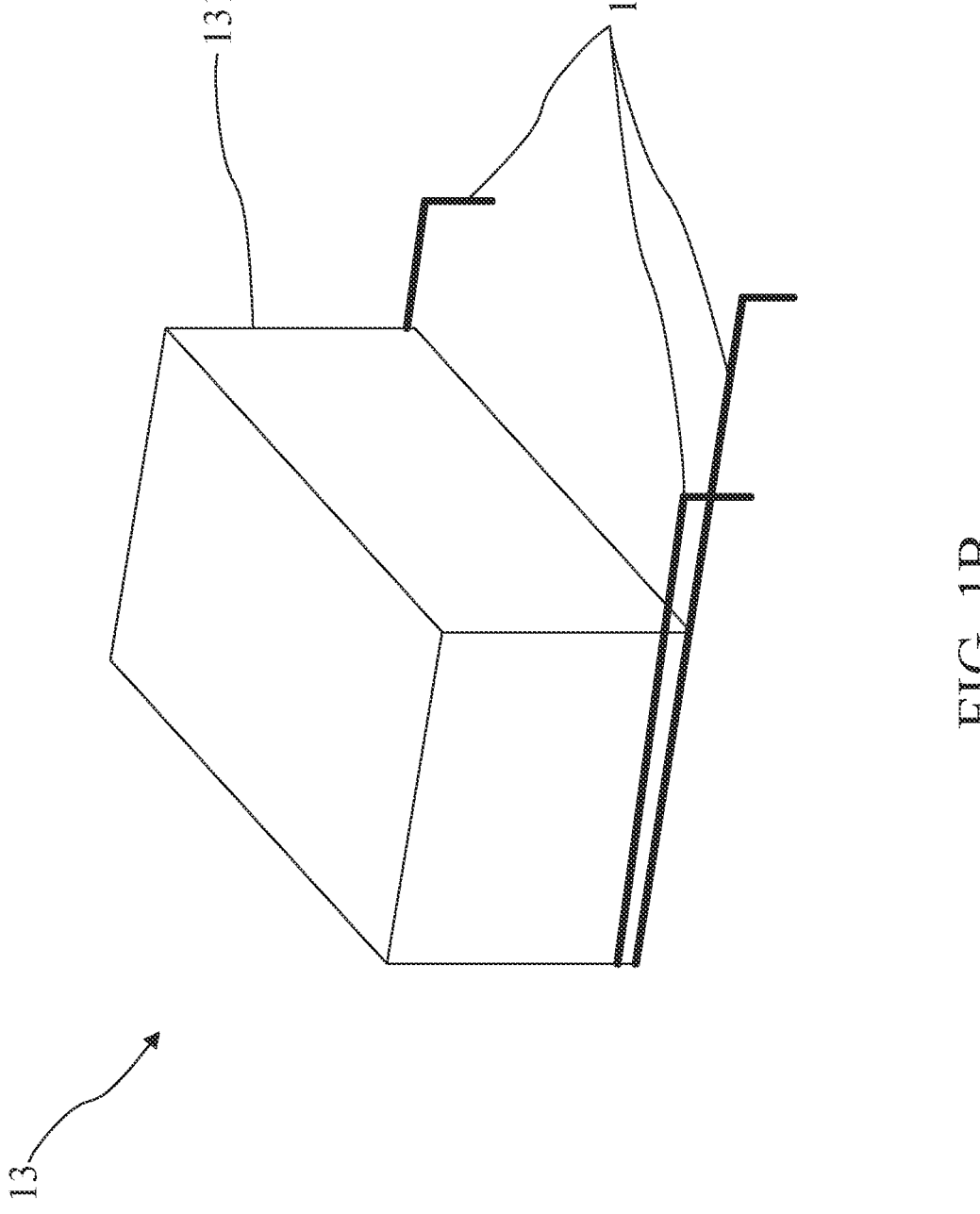
FIG. 1B is a schematic view of a probe device according to some embodiments of the disclosure.
Figure 1C:
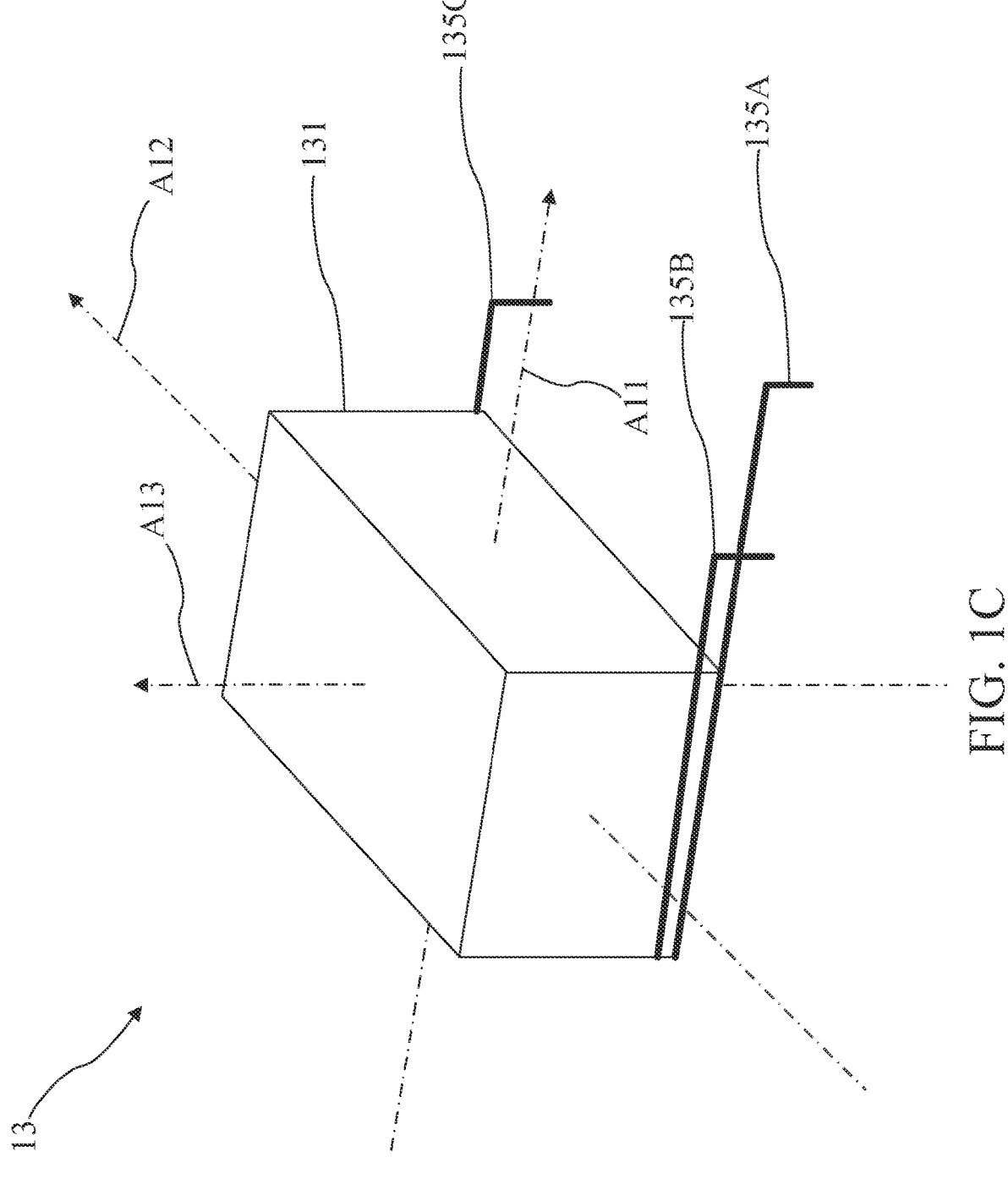
FIGS. 1C to 1H illustrate adjustment of the relative orientation between an optical probe and a reference region according to some embodiments of the disclosure.

FIG. 1A is a schematic view of a probe system 1 according to some embodiments of the disclosure. The probe system 1 includes a frame 11 and a probe device 13. The frame 11 and the probe device 13 are assembled. FIG. 1B is a schematic view of the probe device 13 according to some embodiments of the disclosure. The probe device 13 includes a body 131, an optical probe 133 and a sensing module 135. The optical probe 133 is disposed on the body 131.

In some embodiments, the optical probe 133 may include an optical fiber array block (FAB). In some embodiments, the sensing module 135 is disposed on the body 131 or disposed on the frame 11. The sensing module 135 includes at least one sensor for sensing contact with object.

FIGS. 1C to 1H illustrate adjustment of the relative orientation between the optical probe 133 and a reference region 9 according to some embodiments of the disclosure. In some embodiments, the sensing module 135 is configured to adjust at least one relative orientation between the optical probe 133 and the reference region 9. In particular, the sensing module 135 includes a first pin 135A, a second pin 135B and a third pin 135C. The first pin 135A and the second pin 135B are arranged along a direction of an axis A11 (e.g., an X axis in 3D space) and configured to adjust a first relative orientation between the optical probe 133 and the reference region 9. The second pin 135B and the third pin 135C are arranged along a direction of a second axis A12 (e.g., a Y axis in 3D space) and configured to adjust a second relative orientation between the optical probe 133 and the reference region 9.

Figure 1D:
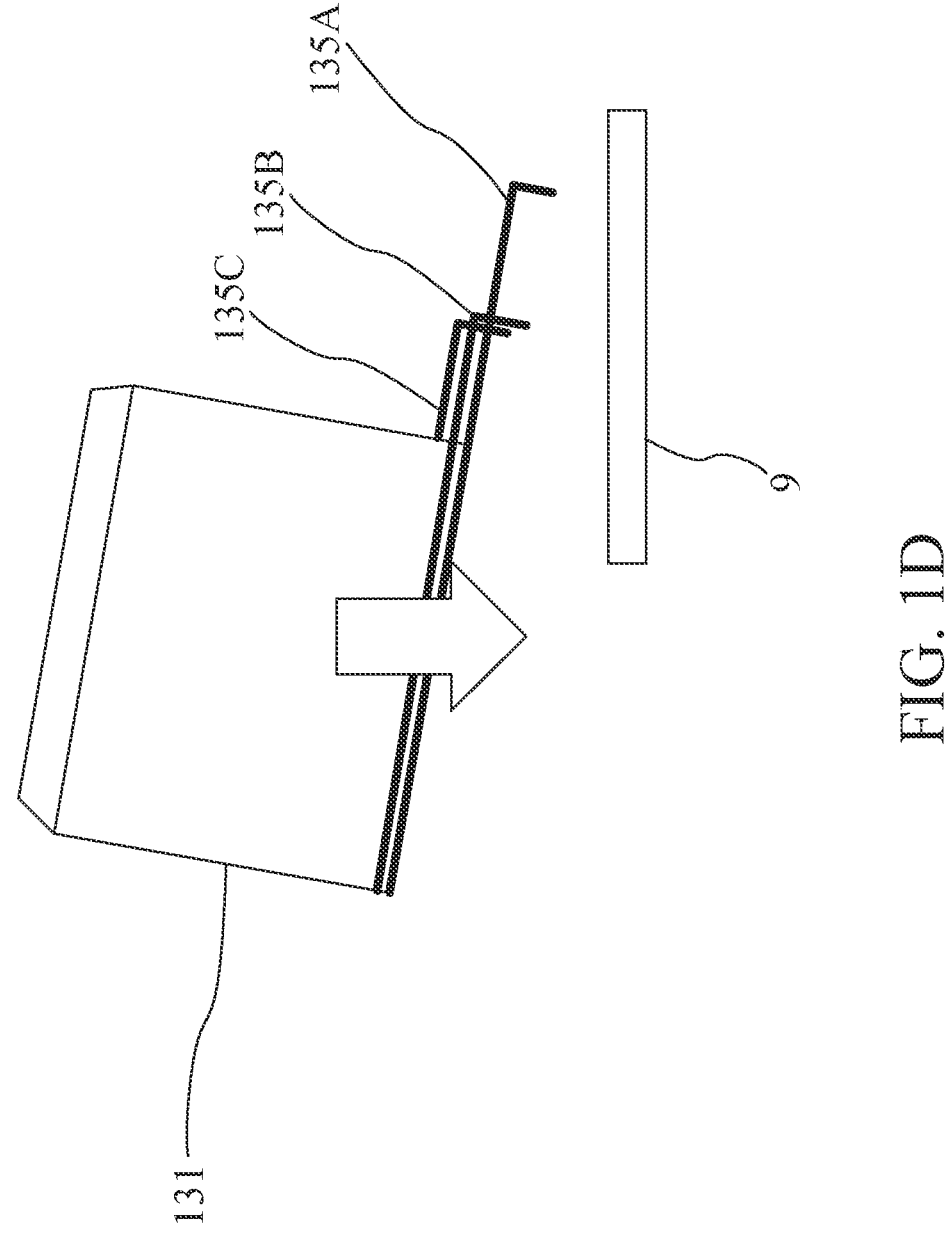
Figure 1E:
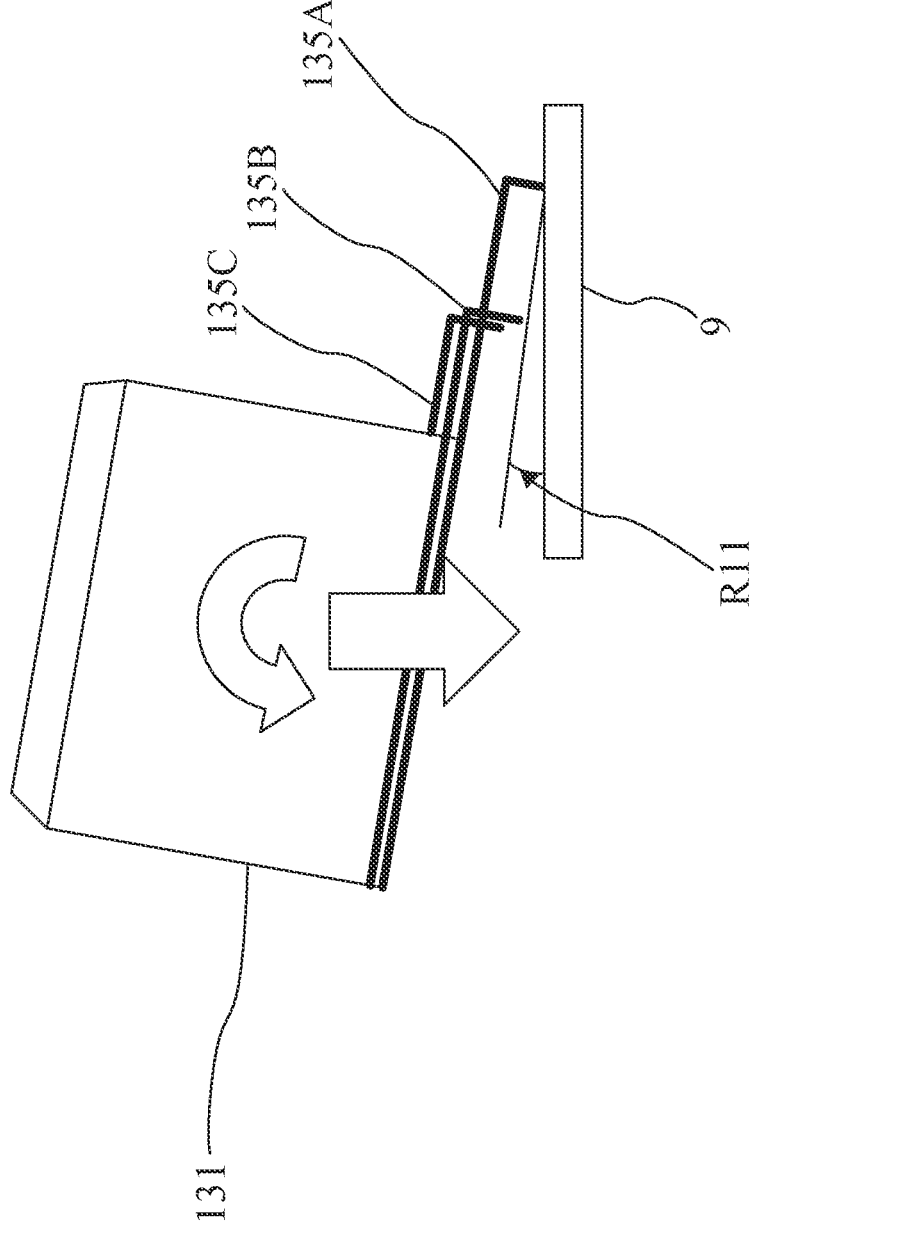
Figure 1F:
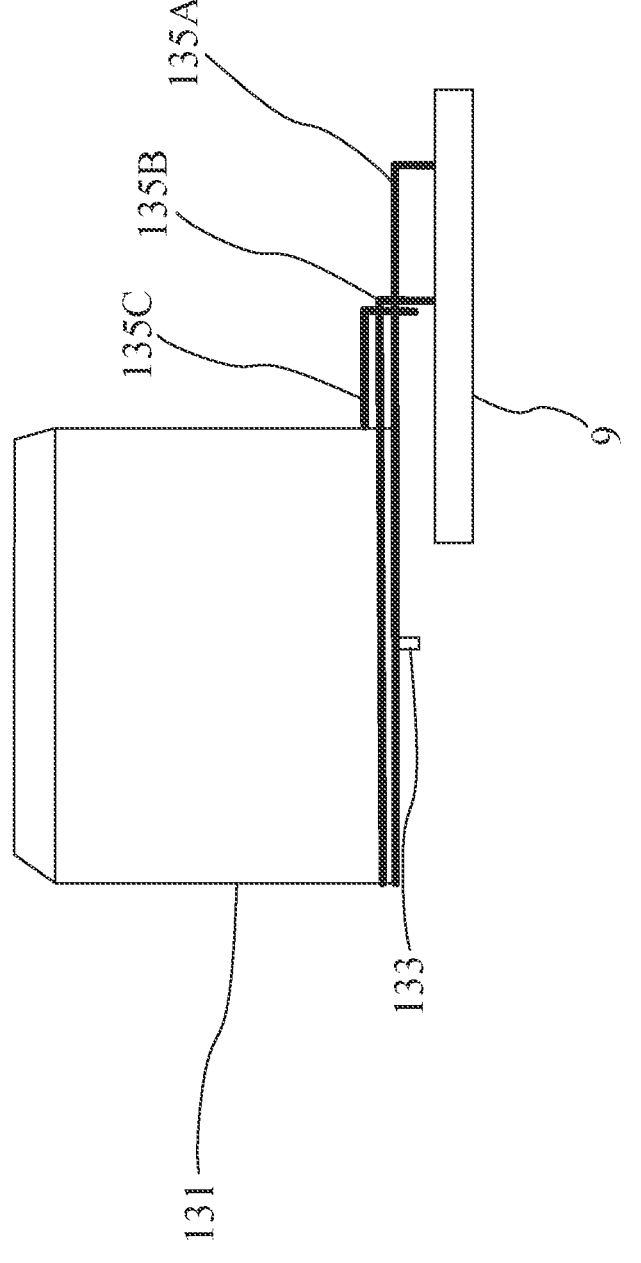
Figure 1G:
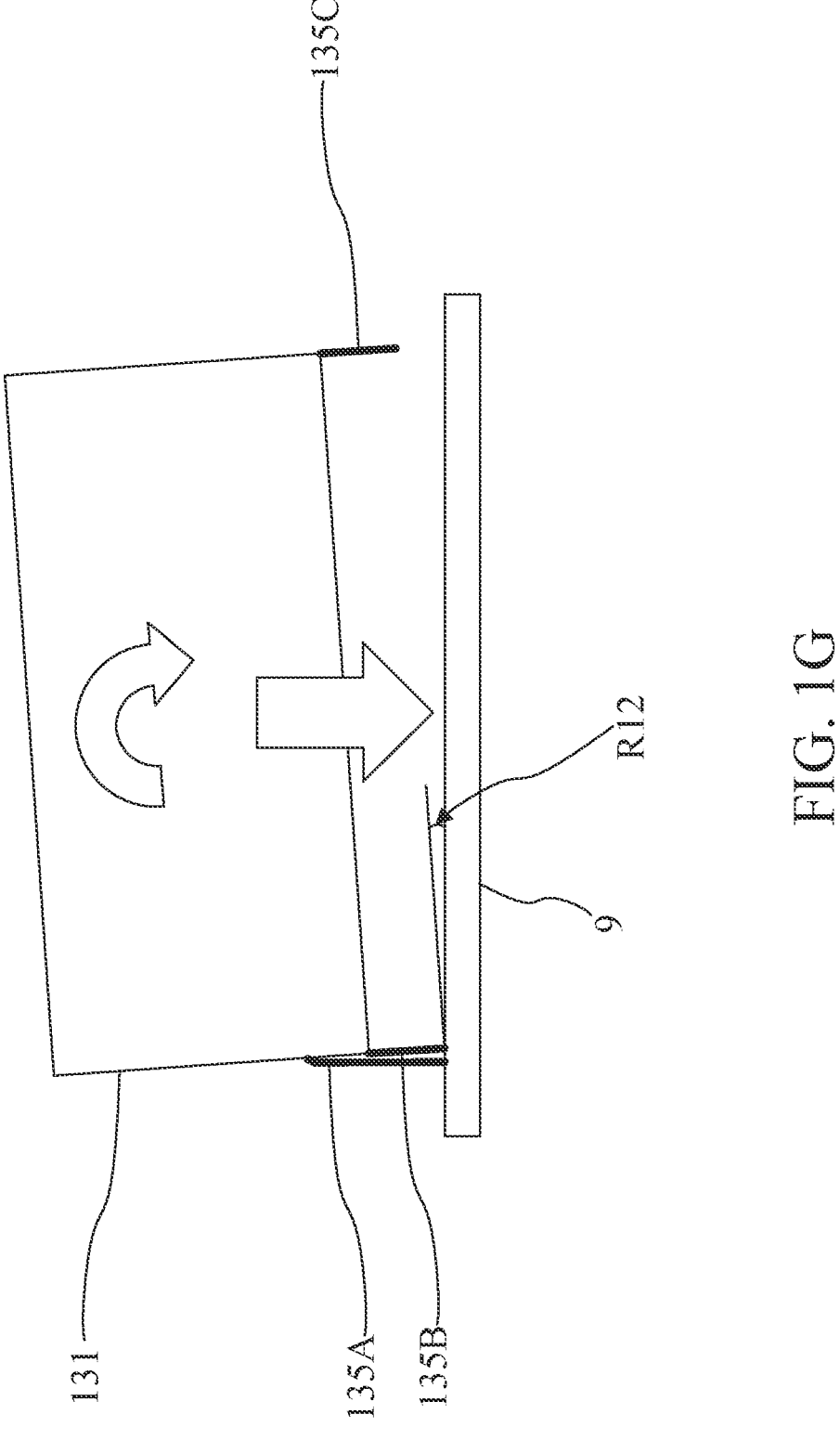
Figure 1H:
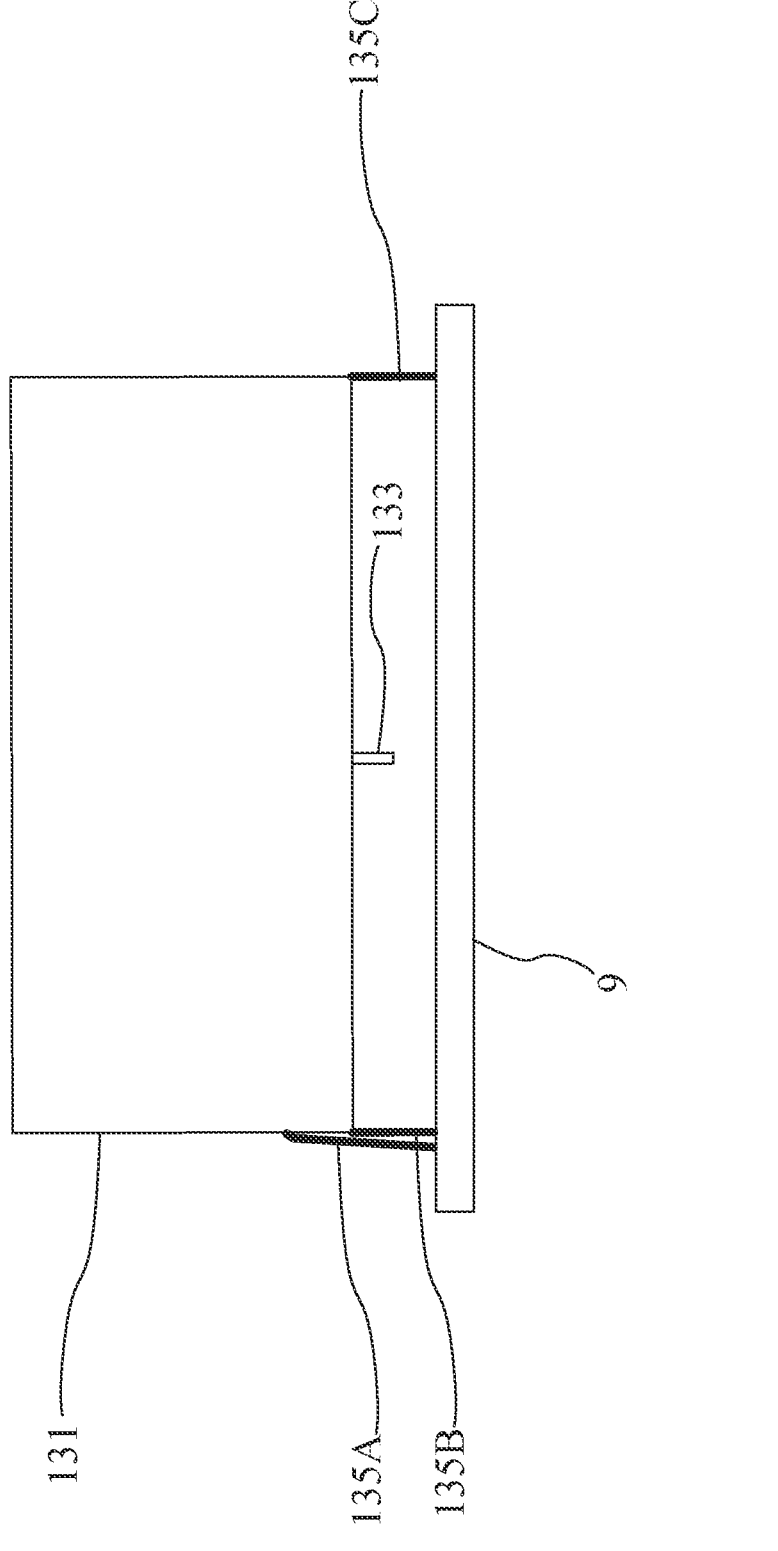
Figure 11:
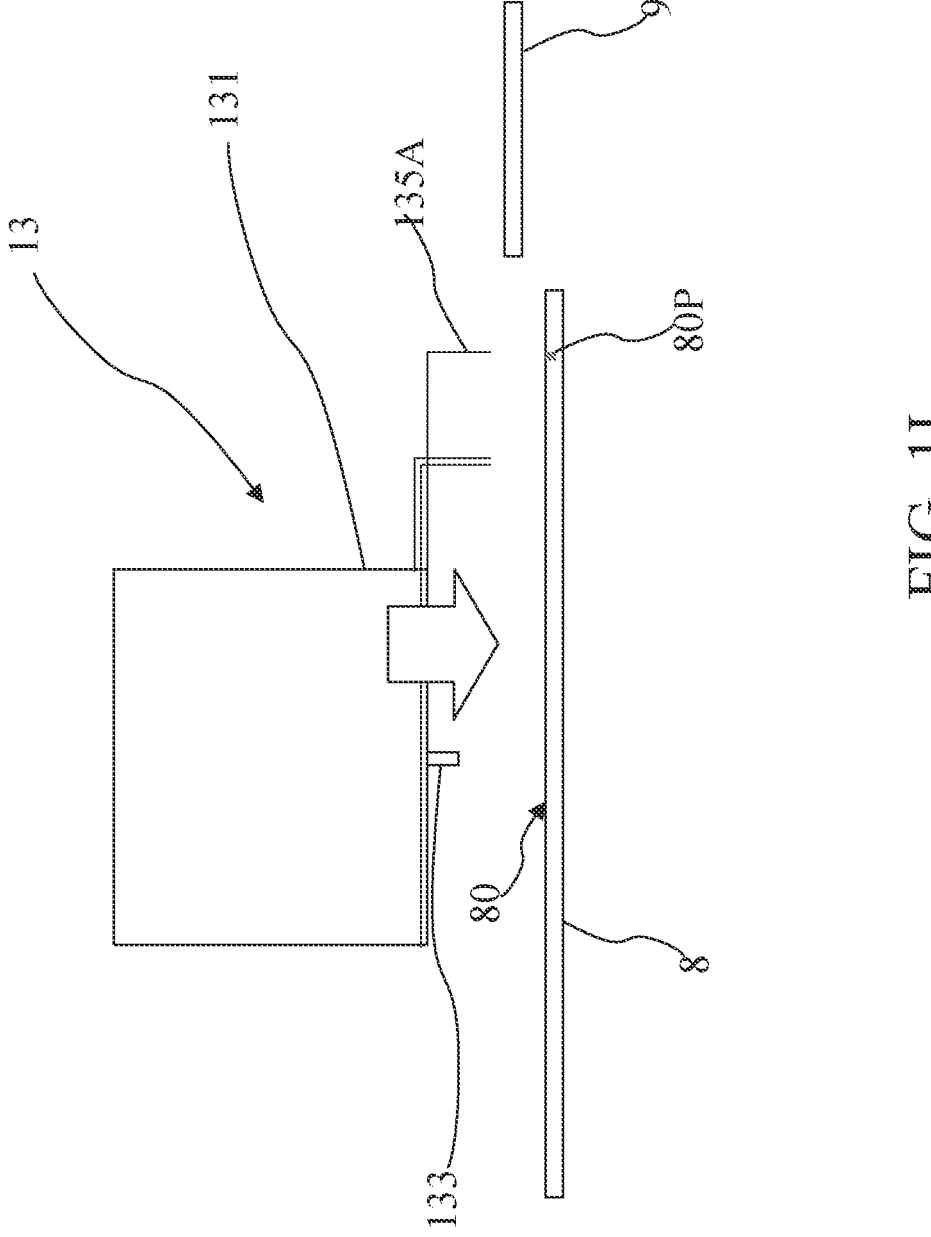

In some embodiments, the probe device 13 initially rotates about an axis A13 (e.g., a Z axis in 3D space) which is perpendicular to the axis A11 and the axis A12. As shown in FIG. 1D, the probe device 13 then approaches the reference region 9 along the axis A13 until one of the pins (i.e., the first pin 135A in FIG. 1D) touches the reference region 9. As shown in FIGS. 1E and 1F, the probe device 13 then rotates about the axis A12 and keeps approaching the reference region 9 along the axis A13 until two of the pins (i.e., both the first pin 135A and the second pin 135B in FIG. 1F) touch the reference region 9. As shown in FIGS. 1G and 1H, the probe device 13 then rotates about the axis A11 and keeps approaching the reference region 9 along the axis A13 until the three pins (i.e., the first pin 135A, the second pin 135B and the third pin 135C in FIG. 1H) touch the reference region 9.

In some embodiments, the total amount of the rotation from the first pin 135A touches the reference region 9 to the first pin 135A and the second pin 135B touch the reference region 9 is a rotation R11 shown in FIG. 1E. The total amount of the rotation from the first pin 135A and the second pin 135B touch the reference region 9 to the first pin 135A, the second pin 135B and the third pin 135C touch the reference region 9 is a rotation R12 shown in FIG. 1G. Accordingly, the relative orientations between the optical probe 133 of the probe device 13 and the reference region 9 are adjusted.

In some embodiments, as shown in FIG. 1I, by moving the probe device 13 or moving a DUT 8 which is parallel with the reference region 9, the optical probe 133 may be aligned with a light transmission device (not shown) exposed on a surface 80 of the DUT 8. In particular, because the reference region 9 is parallel with the surface 80 of the DUT 8, the adjustment for the relative orientations between the optical probe 133 and the reference region 9 may be applied to the relative orientations between the optical probe 133 and the surface 80 of the DUT 8 as well so that an optical path between the optical probe 133 and the light transmission device exposed on the surface 80 of the DUT 8 is corrected. In some embodiments, the reference region 9 can be: (1) an auxiliary chuck; or (2) a testkey of scribe line of the DUT 8.

Figure 1J:
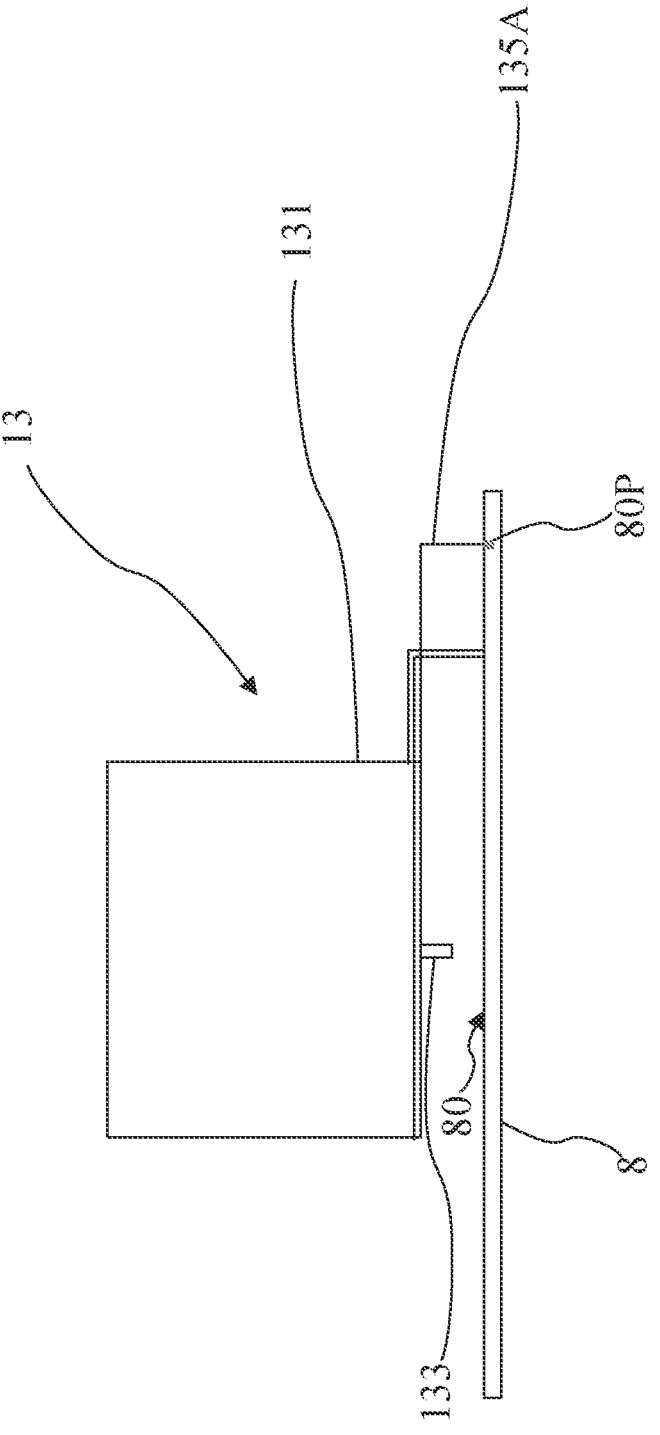
FIGS. 1J to 1L illustrate adjustment of the relative position between the optical probe and the DUT according to some embodiments of the disclosure.
Figure 1K:
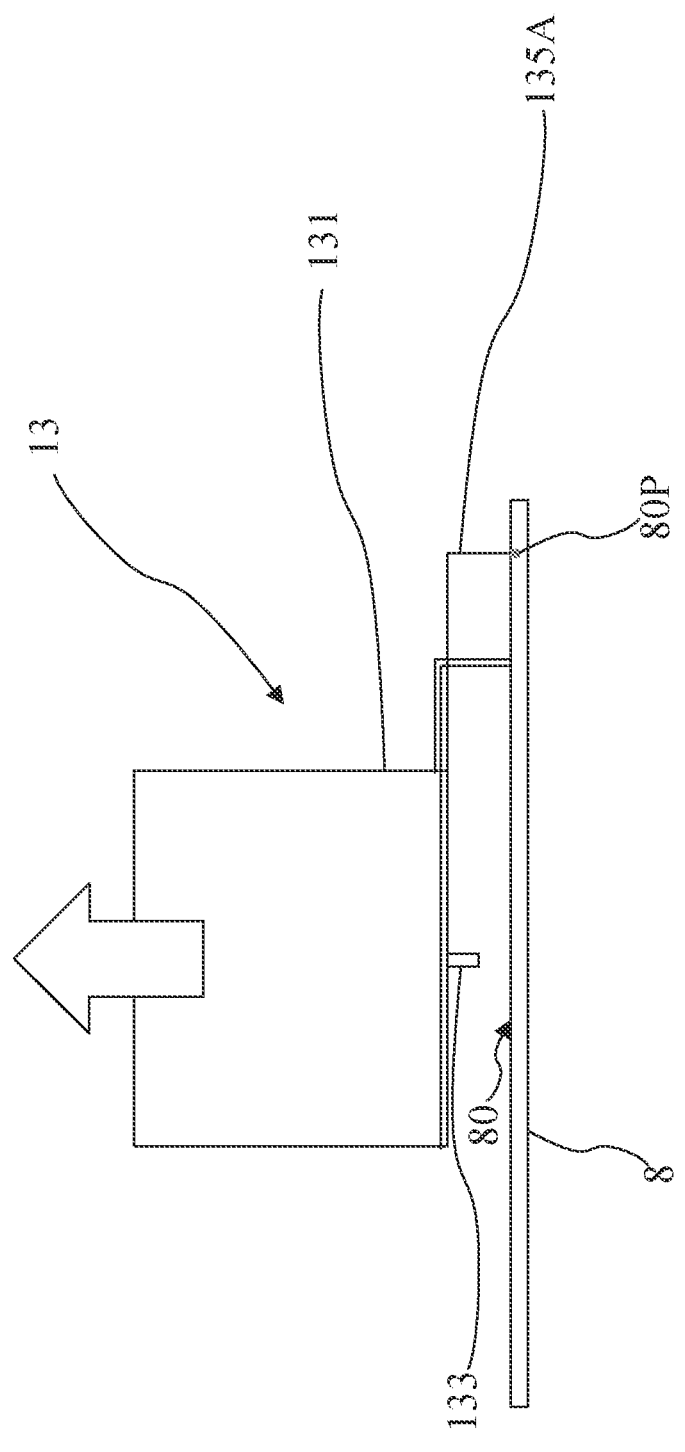
Figure 1L:
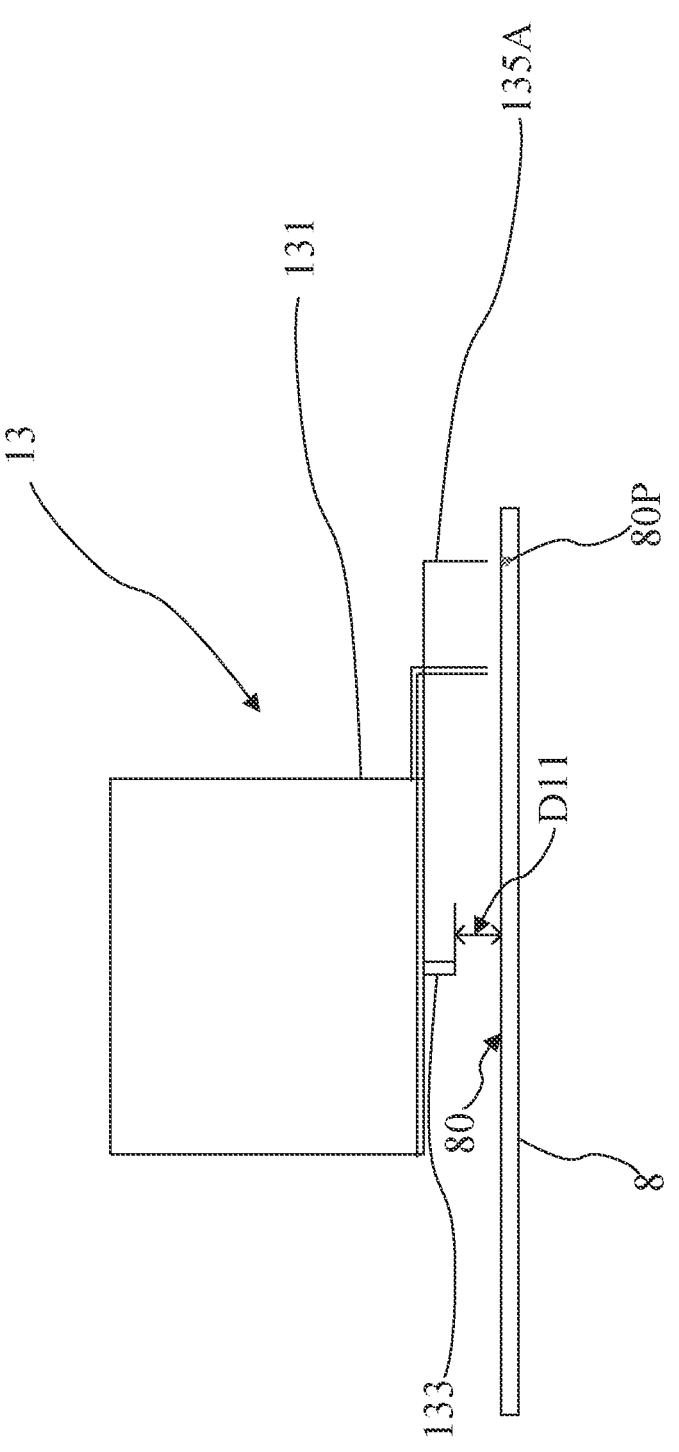

FIGS. 1J to 1L illustrate adjustment of the relative position between the optical probe 133 and the DUT 8 according to some embodiments of the disclosure. In some embodiments, at least one of the pins 135A to 135C touches at least one locating point 80P on the surface 80 of the DUT 8 for initialing the adjustment procedure. Specifically, in these embodiments, to align the optical probe 133 with the light transmission device exposed on the surface 80, the probe device 13 or the DUT 8 is moved until the pin 135A touches the locating point 80P on the surface 80. When the pin 135A touches the locating point 80P on the surface 80, the probe device 13 is moved away from the surface 80 of the DUT 8 (or the DUT 8 is moved away from the probe device 13) for a distance so that the optical probe 133 is a desired distance D11 away from the surface 80 of the DUT 8.

In some embodiments, the probe device 13 may be optionally moved toward to or away from the surface 80 of the DUT 8 (or the DUT 8 may be optionally moved toward to or away from the probe device 13) for a distance so that the optical probe 133 is another desired distance away from the surface 80 of the DUT 8.

In some embodiments, because parameters of the dimensions of the probe device 13, the DUT 8 and the reference region 9 are fixed, movement(s) for adjusting the relative position between the optical probe 133, the DUT 8 and the reference region 9 is (are) calculable. Accordingly, after the relative orientations between the optical probe 133 and the reference region 9 are adjusted, the relative position between the optical probe 133, the DUT 8 and the reference region 9 may be achieved based on the calculated movement(s).

Figure 1N:
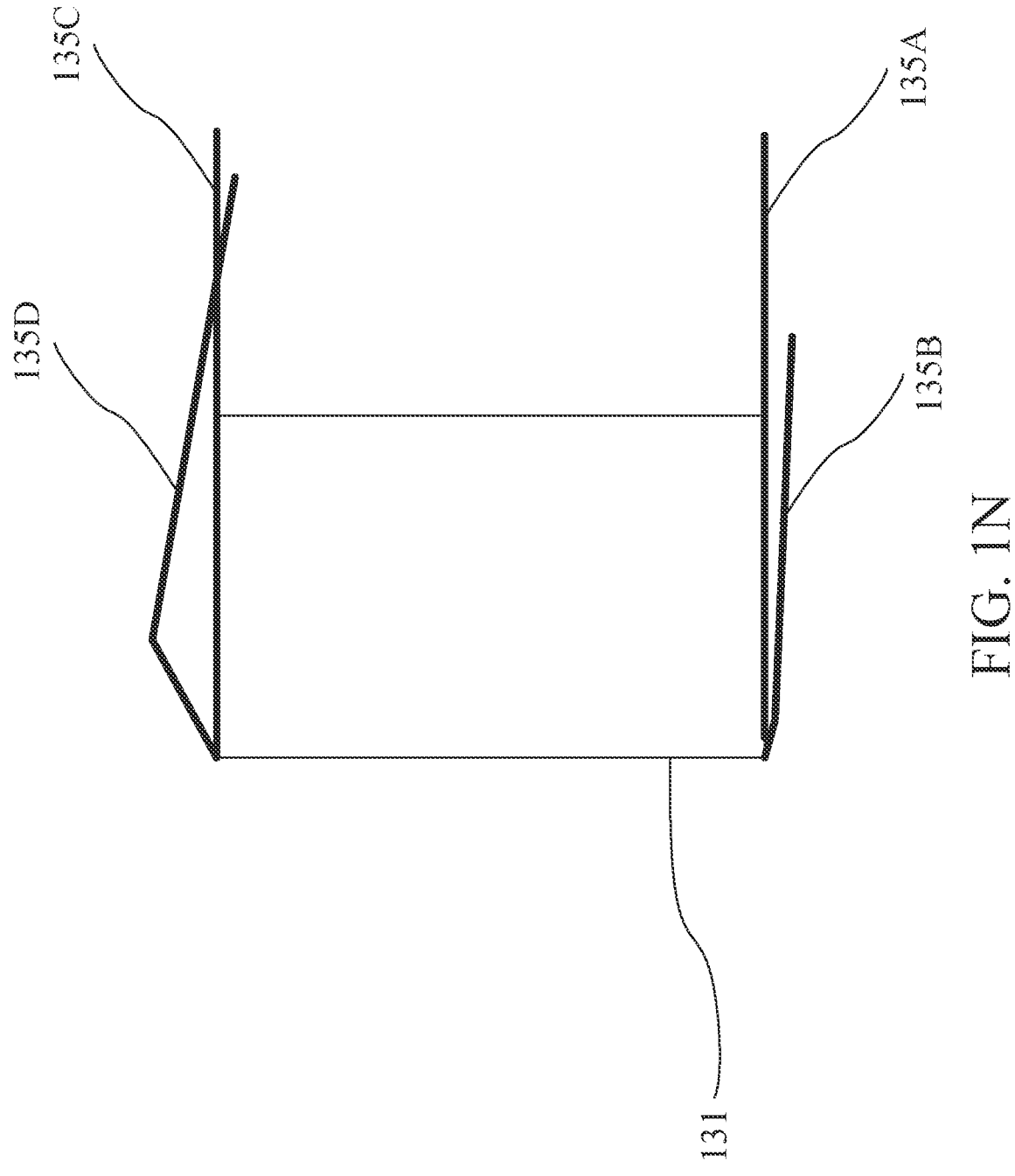

FIGS. 1M and 1N are schematic views of a probe device 13' according to some embodiments of the disclosure. In particular, the difference between the probe device 13 and the probe device 13' is that the sensing module 135 of the probe device 13' further includes a pin 135D. A circuit is between the pin 135D and one of the pins 135A to 135C, and whether the probe device 13' moves toward the DUT 8 depends on a status of the circuit is open or short.

In some embodiments, the pin 135D is below the pin 135C and is in contact with the pin 135C so that a status of the circuit between the pin 135D and the pin 135C is short. In particular, when the optical probe 133 is aligned with the light transmission device exposed on the surface 80, the probe device 13' is moved toward to the surface 80 of the DUT 8 (or the DUT 8 is moved toward to the probe device 13') with a slow velocity.

During the movement of the probe device 13' (or the DUT), the status of the circuit between the pin 135D and the pin 135C is changed from short to open when: (1) the pin 135C touches the surface of the DUT 8; and (2) the lift of the pin 135C causes the pin 135C being free from in contact with the pin 135D. Then, the probe device 13' stops moving (or the DUT 8 stops moving). Accordingly, the distance between the optical probe 133 and the light transmission device exposed on the surface 80 may be kept safe to prevent damage.

In some embodiments, the pin 135D is above the pin 135C and is free from contacting the pin 135C so that the status of the circuit between the pin 135D and the pin 135C is open. In particular, when the optical probe 133 is aligned with the light transmission device exposed on the surface 80, the probe device 13' is moved toward to the surface 80 of the DUT 8 (or the DUT 8 is moved toward to the probe device 13') with a slow velocity.

During the movement of the probe device 13' (or the DUT), the status of the circuit between the pin 135D and the pin 135C is changed from open to short when: (1) the pin 135C touches the surface of the DUT 8; and (2) the lift of the pin 135C causes the pin 135C being in contact with the pin 135D. Then, the probe device 13' stops moving (or the DUT 8 stops moving). Accordingly, the distance between the optical probe 133 and the light transmission device exposed on the surface 80 can be kept safe to prevent damage.

It should be noted that, in some embodiments, the above scheme between the pin 135D and the pin 135C may be applied to the pin 135D and any pin of pins 135A, 135B.

Figure 2A:
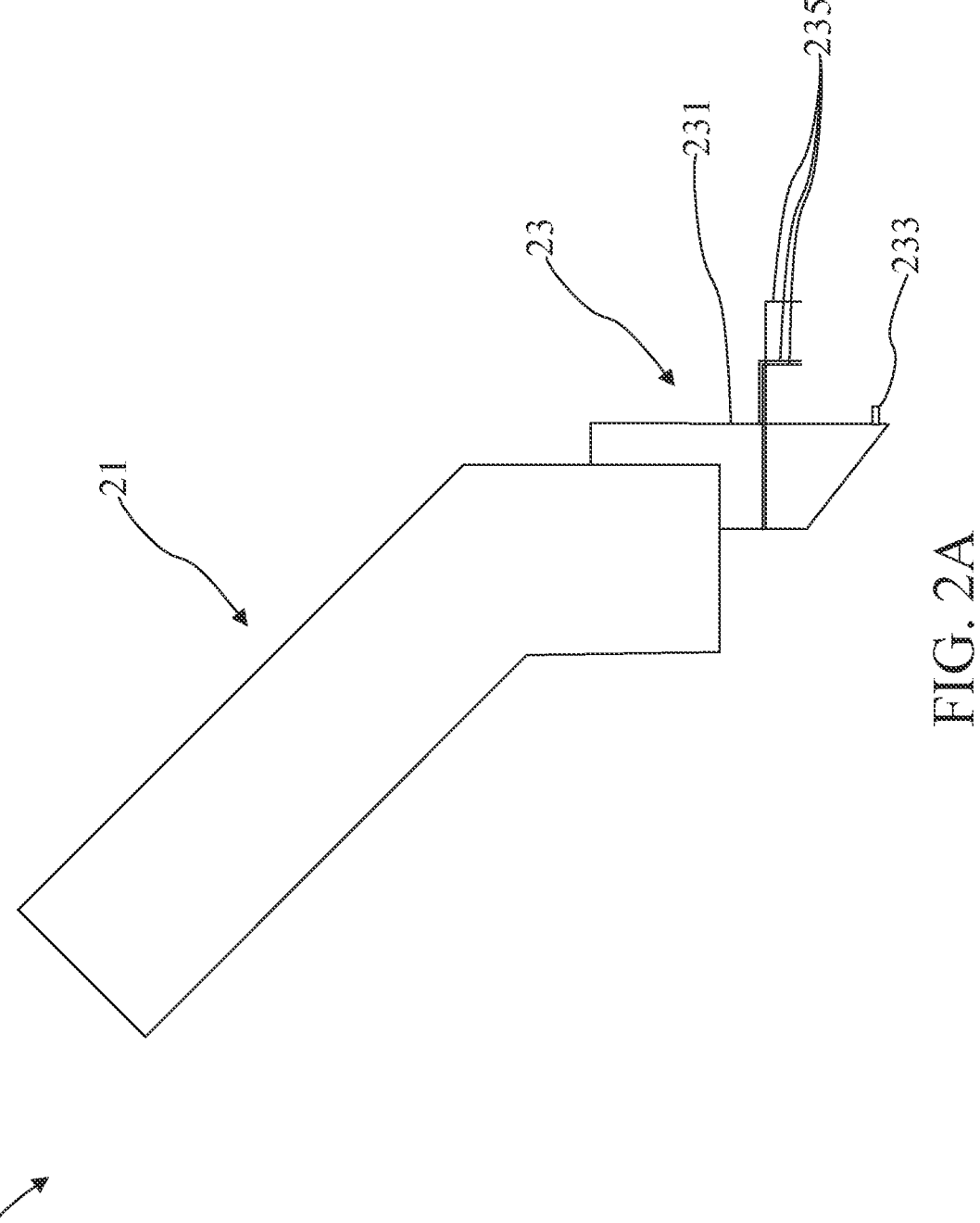
FIG. 2A is a schematic view of a probe system according to some embodiments of the disclosure.
Figure 2C:
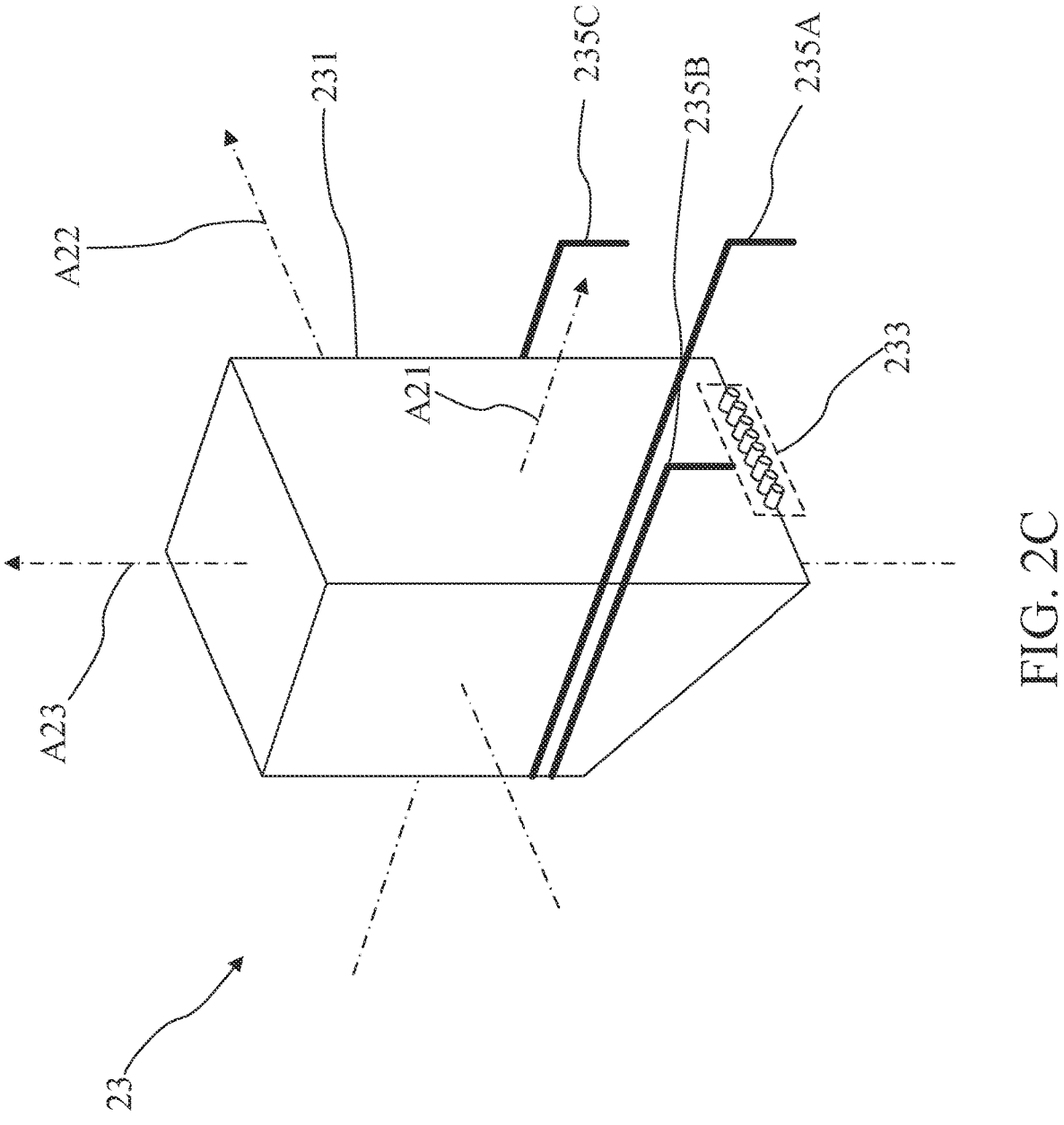
FIGS. 2C to 2H illustrate adjustment of the relative orientation between an optical probe and a reference region according to some embodiments of the disclosure.

FIG. 2A is a schematic view of a probe system 2 according to some embodiments of the disclosure. The probe system 2 includes a frame 21, a probe device 23 and a sensing module 235. The frame 21 and the probe device 23 are assembled. FIG. 2B is a schematic view of the probe device 2 according to some embodiments of the disclosure. The probe device 23 includes a body 231 and an optical probe 233.

In some embodiments, the optical probe 233 includes an optical FAB. The optical probe 233 is disposed on the body 231 and protruded from a sidewall 230 of the body 231. In some embodiments, the optical probe 233 is disposed on lower part of the body 231 and laterally protruded from the sidewall 230 of the body 231. In some embodiments, the sensing module 235 is disposed on the body 231 or disposed on the frame 21. The sensing module 235 includes at least one sensor for sensing contact with object.

FIGS. 2C to 2I illustrate adjustment of the relative orientation between the optical probe 233 and a reference region 7 according to some embodiments of the disclosure. In some embodiments, the sensing module 235 includes a first pin 235A, a second pin 235B and a third pin 235C. The first pin 235A and the second pin 235B are arranged along a direction of an axis A21 (e.g., an X axis in 3D space) and configured to adjust a first relative orientation between the optical probe 233 and the reference region 7. The second pin 235B and the third pin 235C are arranged along a direction of an axis A22 (e.g., a Y axis in 3D space) and configured to adjust a second relative orientation between the optical probe 233 and the reference region 7.

Figure 2D:
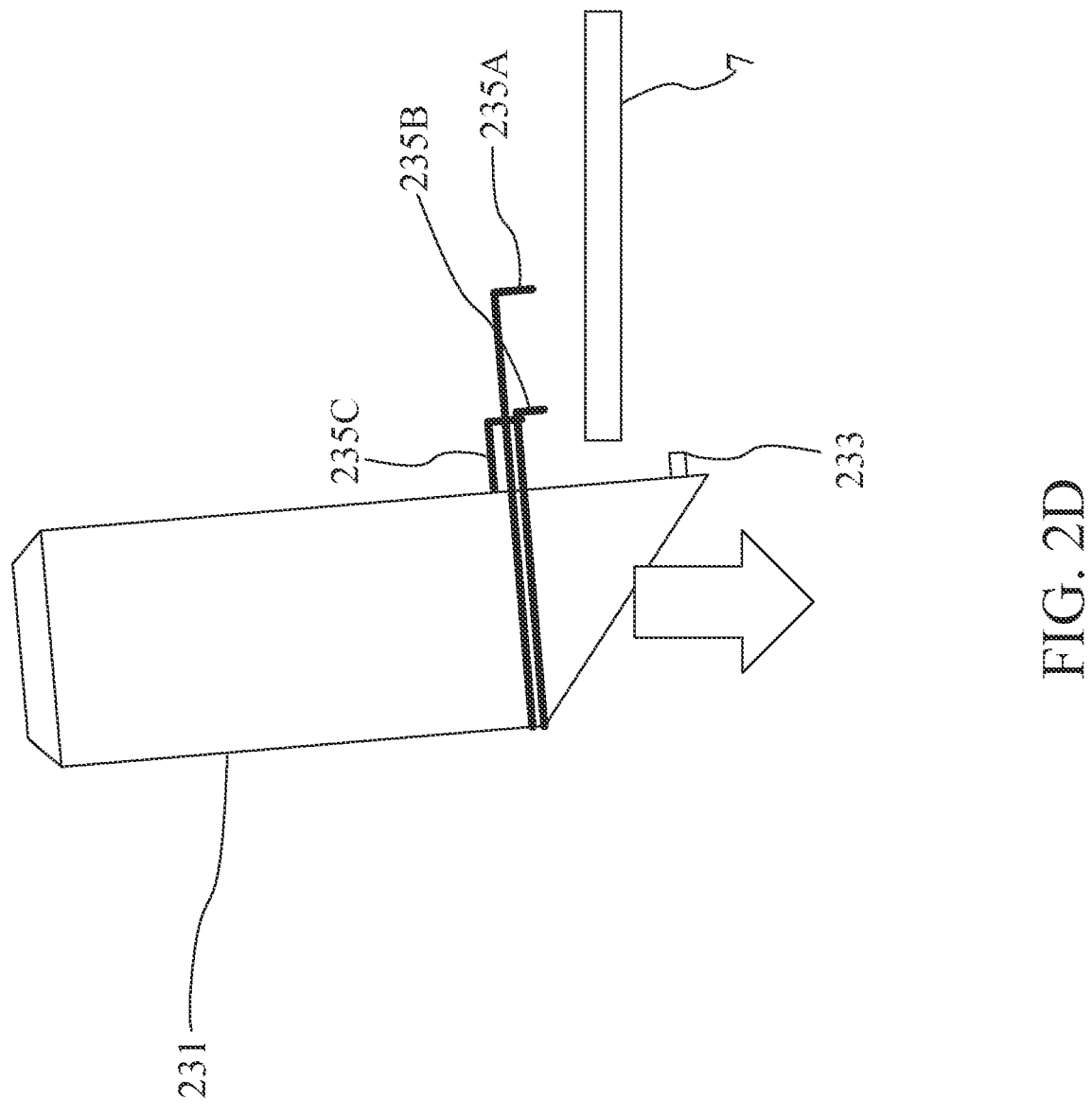
Figure 2E:
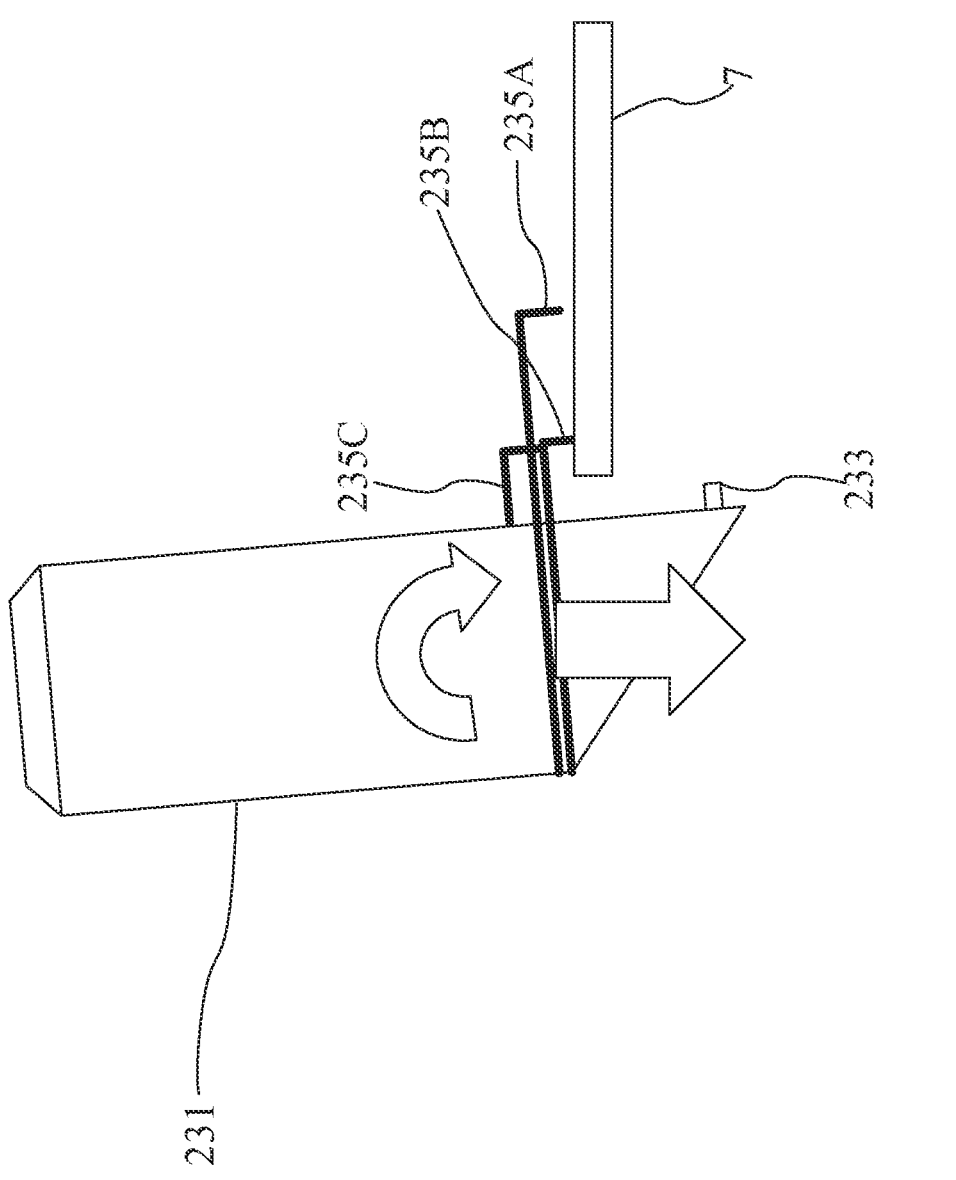
Figure 2F:
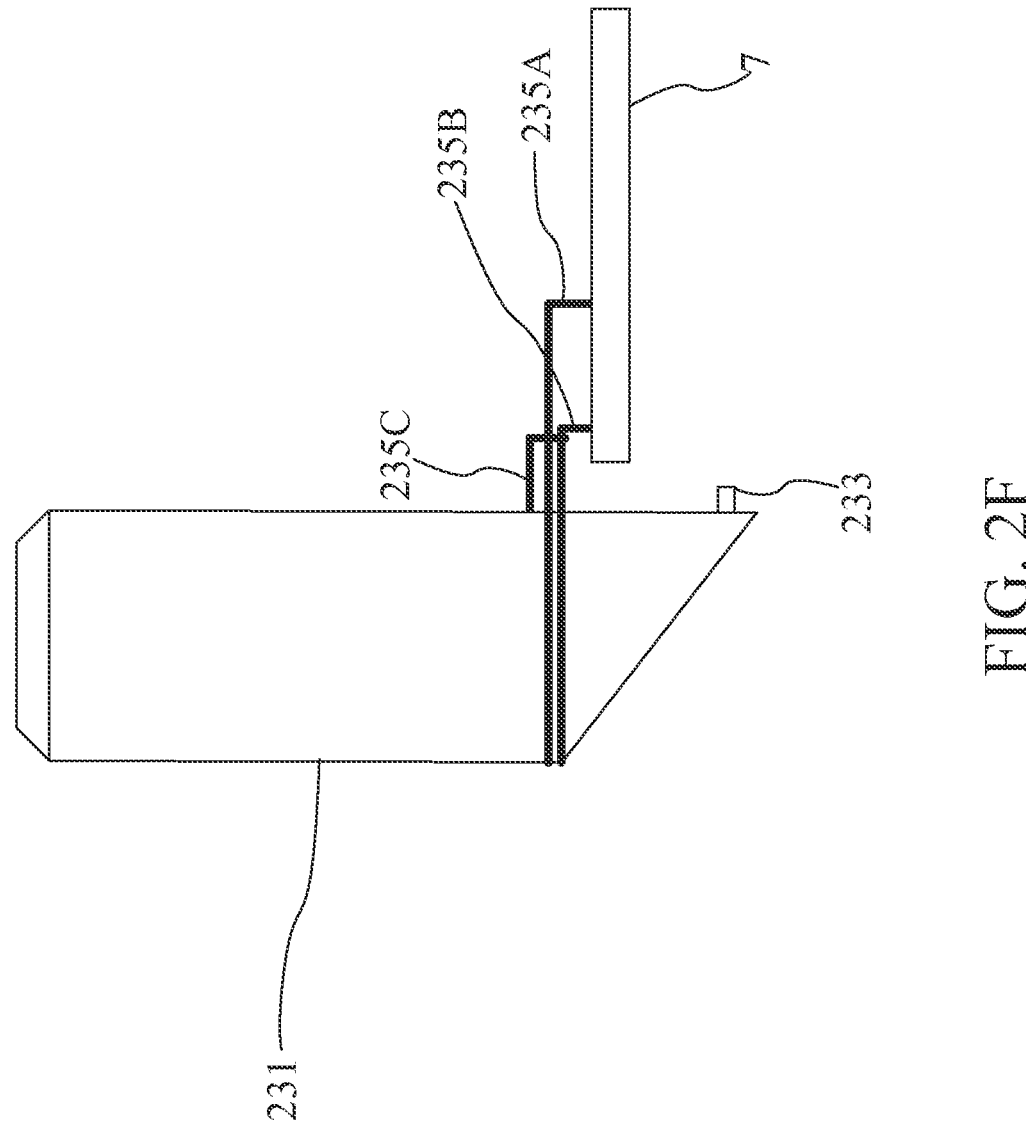
Figure 2G:
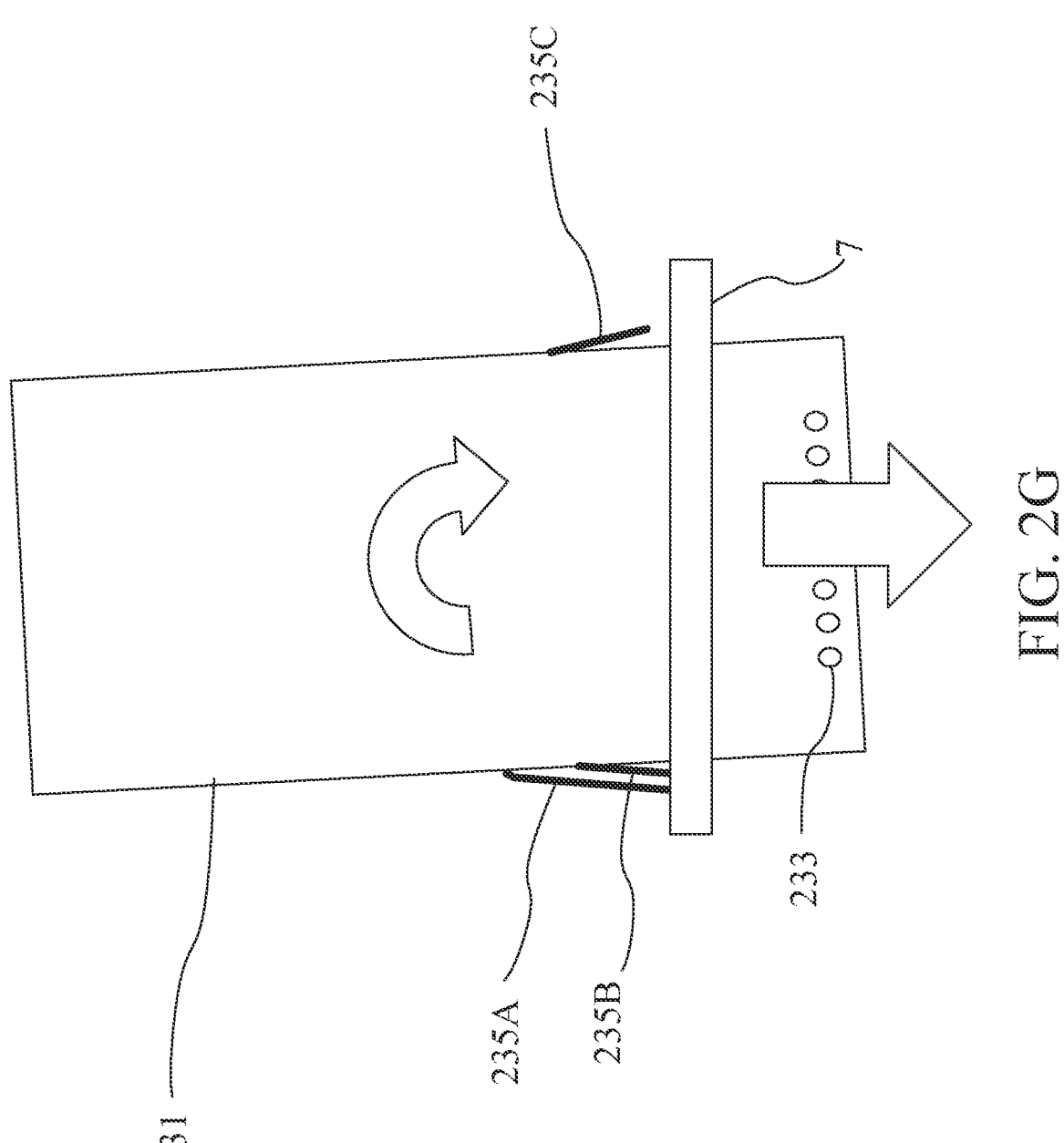
Figure 2H:
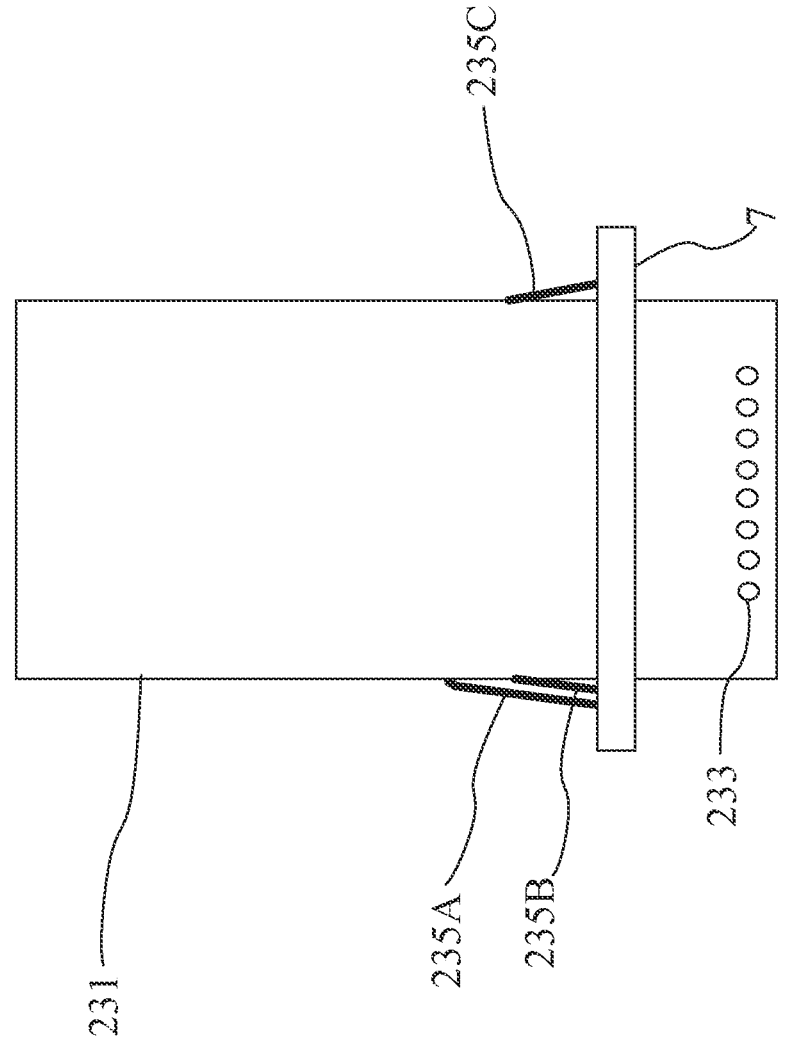
Figure 21:
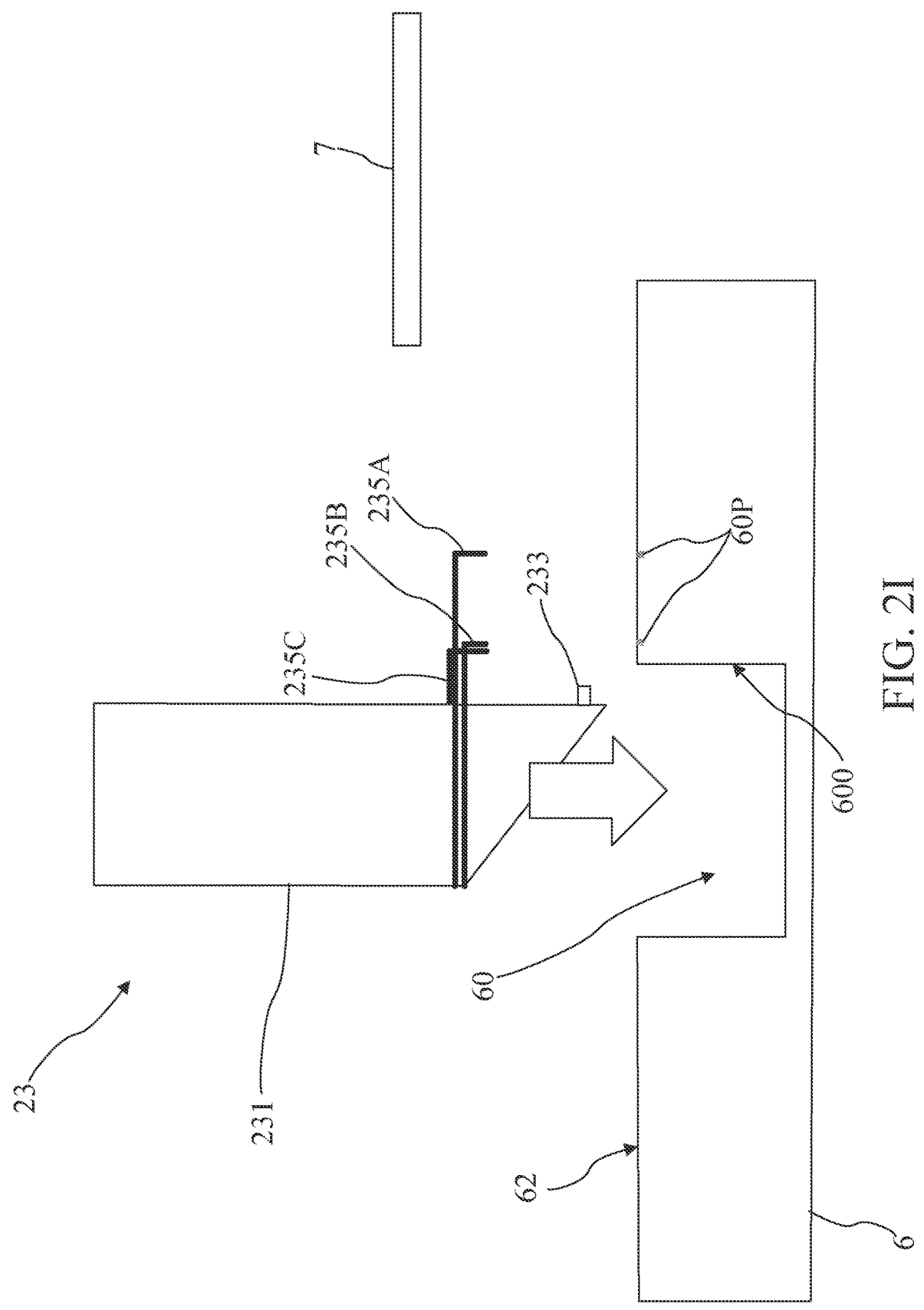

In some embodiments, the probe device 23 initially rotates about an axis A23 (e.g., a Z axis in 3D space) which is perpendicular to the axis A21 and the axis A22. As shown in FIG. 2D, the probe device 23 then approaches the reference region 7 along the axis A23 until one of the pins (i.e., the pin 235B in FIG. 2E) touches the reference region 7. As shown in FIGS. 2E and 2F, the probe device 23 then rotates about the axis A22 and keeps approaching the reference region 7 along the axis A23 until two of the pins (i.e., the first pin 235A and the second pin 235B in FIG. 2F) touch the reference region 7. As shown in FIGS. 2G and 2H, the probe device 23 then rotates about the axis A21 and keeps approaching the reference region 7 along the axis A23 until the three pins (i.e., the first pin 235A, the second pin 235B and the third pin 235C in FIG. 2H) touch the reference region 7. Accordingly, the relative orientations between the optical probe 233 of the probe device 23 and the reference region 7 are adjusted.

Figure 2J:
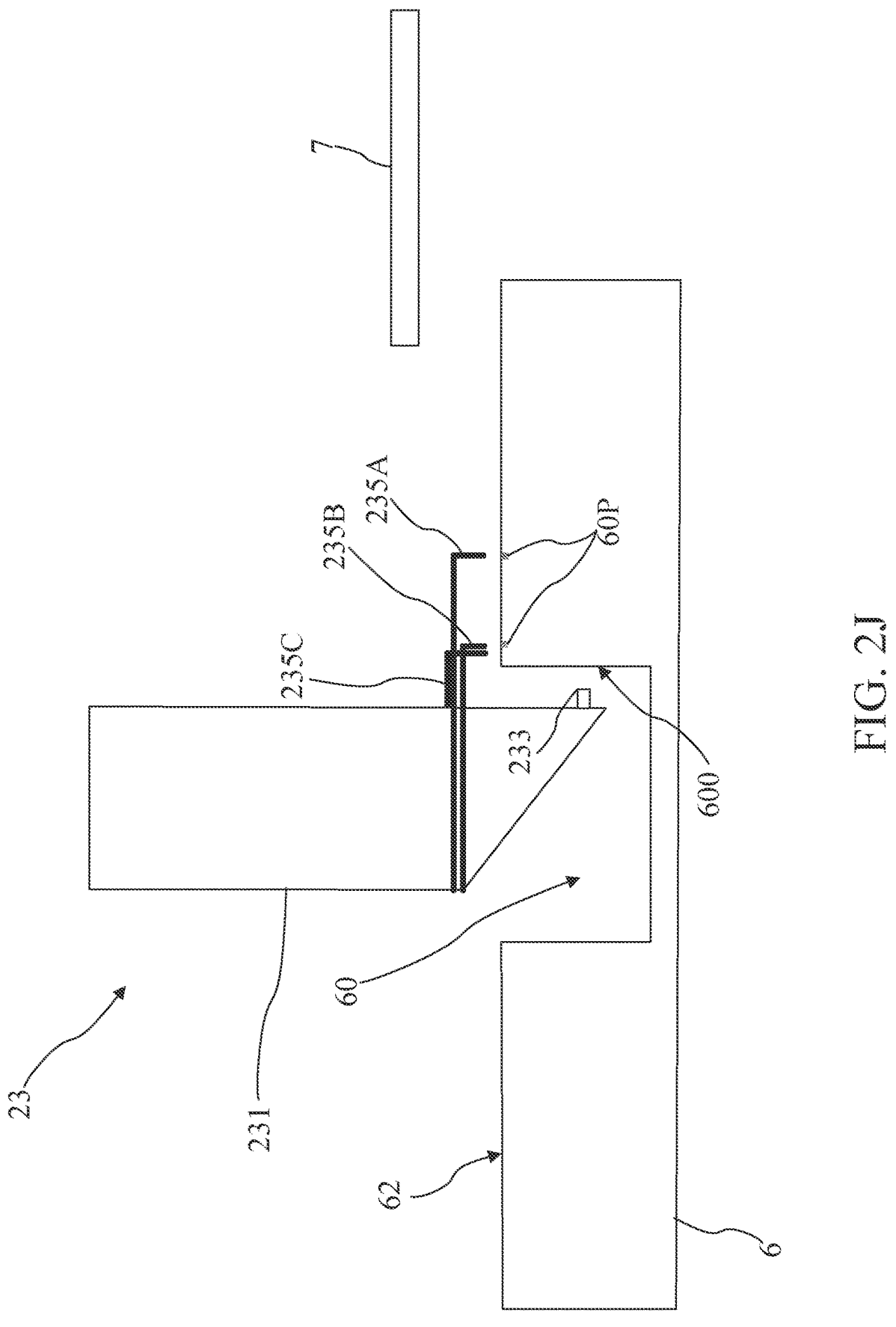

In some embodiments, as shown in FIGS. 2I and 2J, by moving the probe device 23 or moving a DUT 6 which is parallel with the reference region 7, the body 231 is aligned with a trench 60 of the DUT 6. Then, the body 231 is inserted into the trench 60 to align the optical probe 233 to a light transmission device (not shown) exposed on a sidewall 600 of the trench 60. In particular, because the reference region 7 is parallel with a surface 62 of the DUT 6, the adjustment for the relative orientations between the optical probe 233 and the reference region 7 may be applied to the relative orientations between the optical probe 233 and the surface 62 of the DUT 6 as well. Accordingly, the adjustment for the relative orientations between the optical probe 233 and the reference region 7 may be applied to the relative orientations between the optical probe 233 and the sidewall 600 of the trench 60 so that an optical path between the optical probed 233 and the light transmission device exposed on the sidewall 600 of the trench 60 is corrected. In some embodiments, the reference region 7 can be: (1) an auxiliary chuck; or (2) a testkey of scribe line of the DUT 6.

Figure 2K:
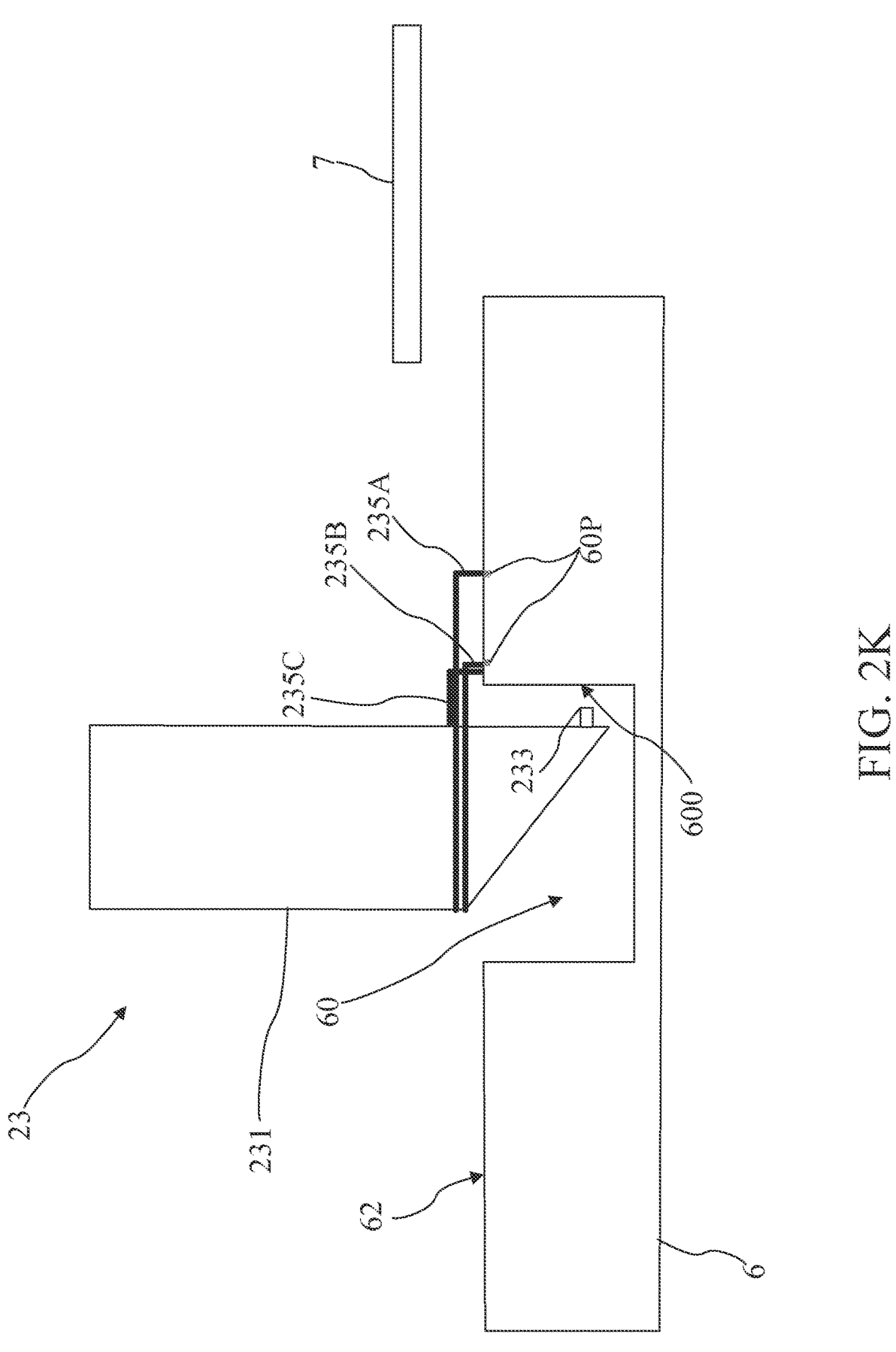
FIGS. 2K to 2M illustrate adjustment of the relative position between the optical probe and the DUT according to some embodiments of the disclosure.
Figure 2L:
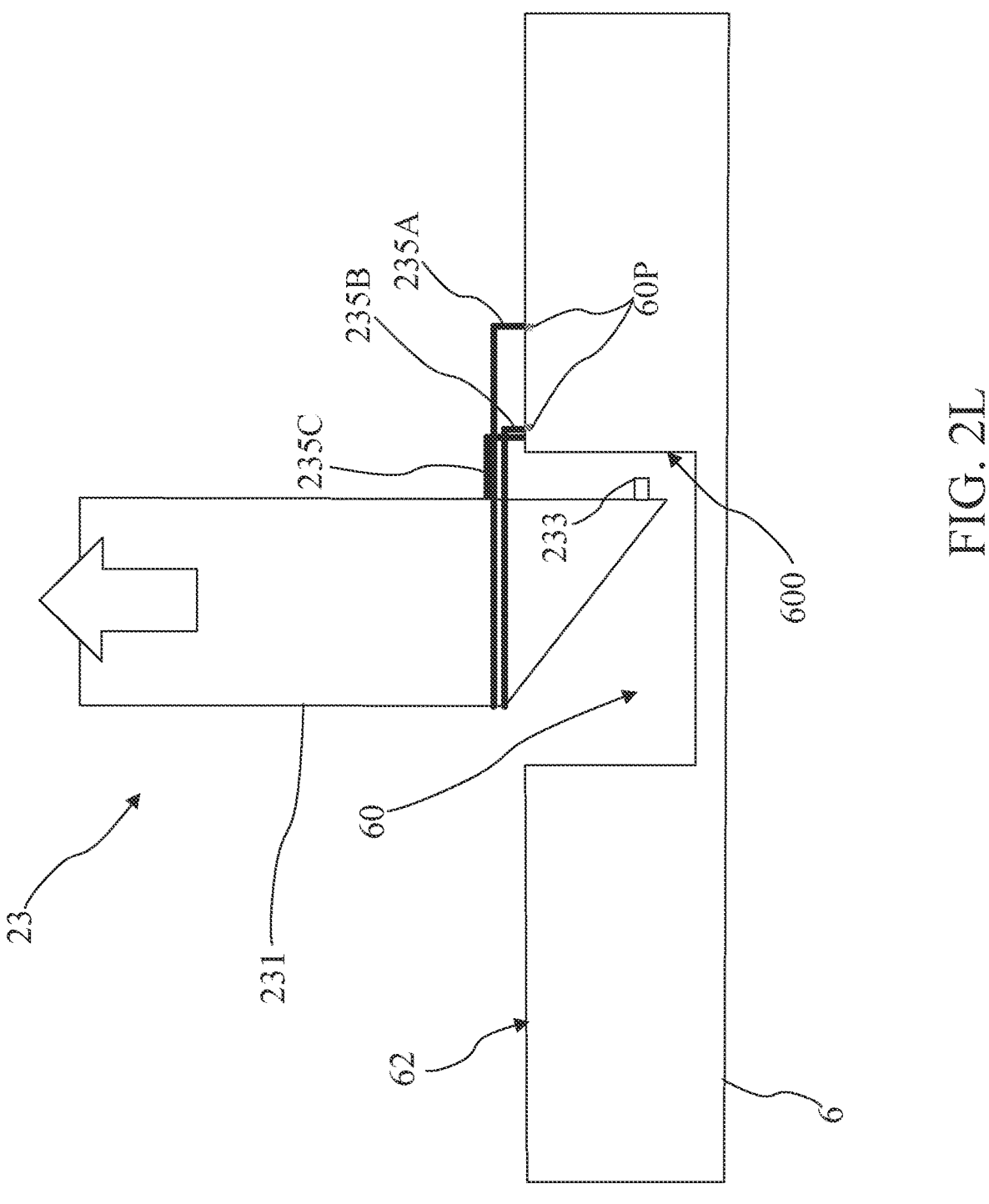
Figure 2M:
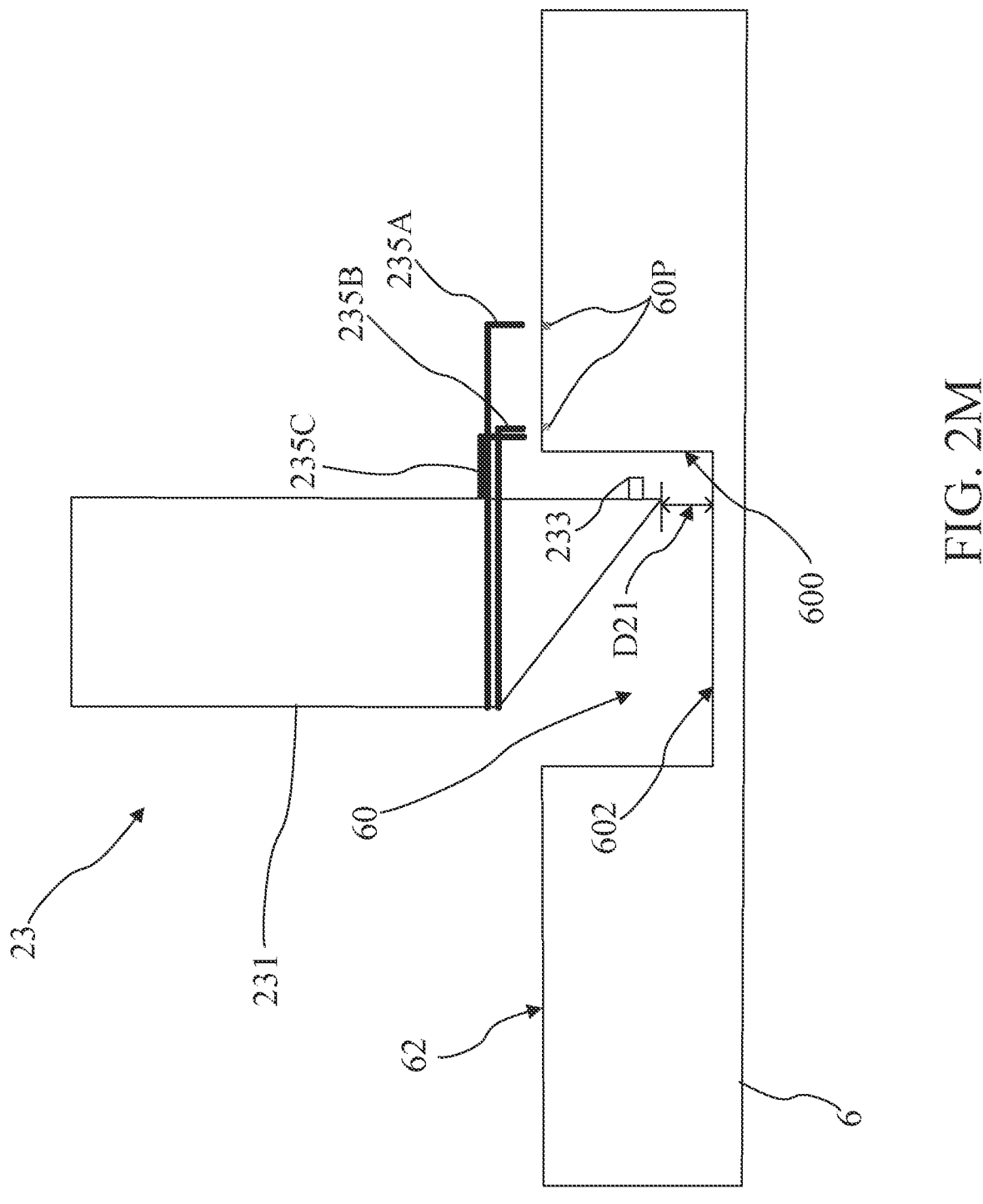

FIGS. 2K to 2M illustrate adjustment of the relative position between the optical probe 233 and the DUT 6 according to some embodiments of the disclosure. In some embodiments, after inserting the probe device 23 into the trench 60 of the DUT 6, at least one of the pins 235A to 235C touches at least one locating point 60P on the surface 62 of the DUT 6 for initialing the adjustment procedure. Specifically, in these embodiments, to align the optical probe 233 with the light transmission device exposed on the sidewall 600 of the trench the probe device 23 or the DUT 6 is moved until the pins 235A and 235B touch the locating points 60P on the surface 60. When the pins 235A and 235B touch the locating points 60P on the surface 60, the probe device 23 is moved away from the surface 62 of the DUT 6 for a distance so that the optical probe 233 is a desired distance D21 away from a bottom 602 of the trench 60.

In some embodiments, the probe device 23 may be optionally moved toward to or away from the surface 60 of the DUT 6 (or the DUT 6 may be optionally moved toward to or away from the probe device 23) for a distance so that the optical probe 233 is another desired distance away from the bottom 602 of the trench 60.

Figure 2N:
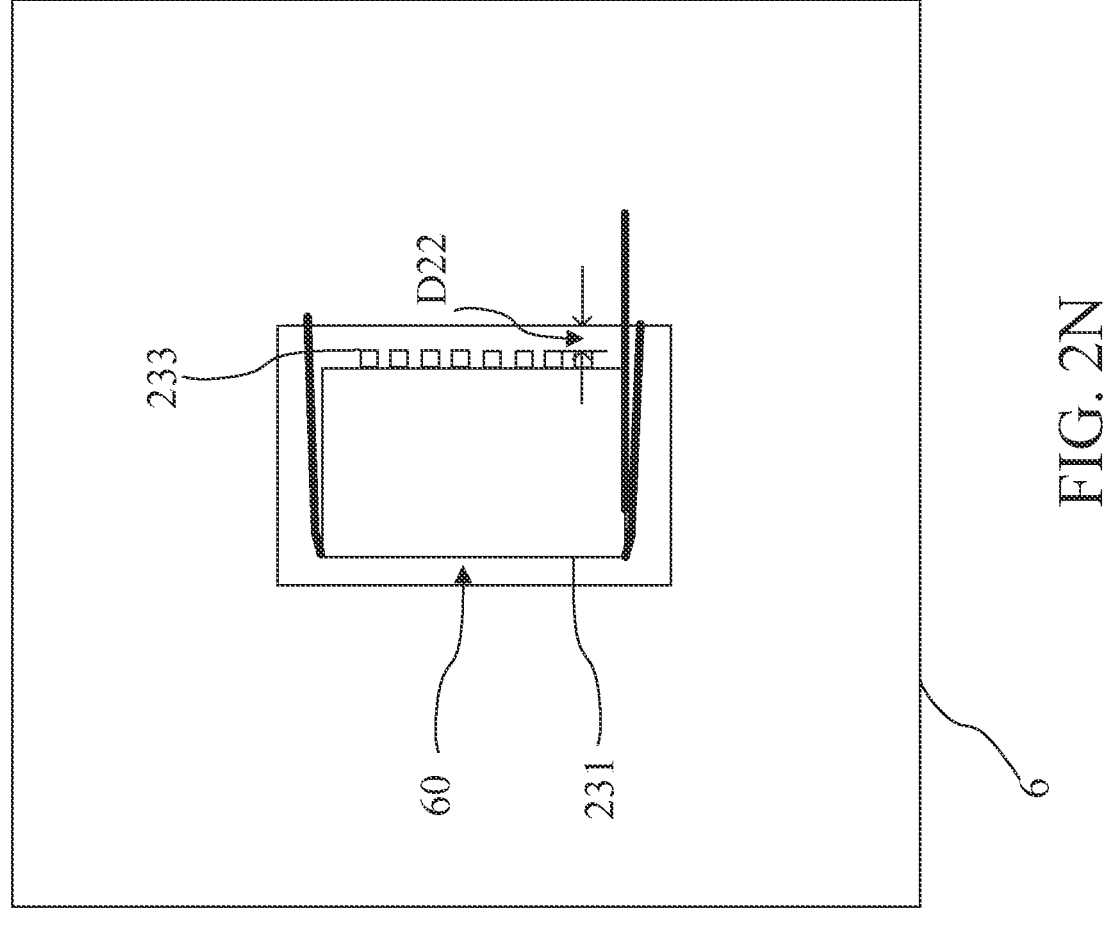
FIG. 2N illustrates adjustment of the relative position between the optical probe and the DUT according to some embodiments of the disclosure.

FIG. 2N illustrates adjustment of the relative position between the optical probe 233 and the DUT 6 according to some embodiments of the disclosure. In some embodiments, a distance between the optical probe 233 and the sidewall 600 of the trench 60 may be adjusted by top view images. In particular, top view images of the probe device 23 and the DUT 6 are captured. Based on image processing technologies, edge of the optical probe 233 and edge of the trench 60 may be recognized and a distance between the edge of the optical probe 233 and the edge of the trench 60 may be determined. Accordingly, the distance between the edge of the optical probe 233 and the edge of the trench 60 may be adjusted by moving the DUT 6 or moving the probe device 23 until a desired distance D22 between the edge of the optical probe 233 and the edge of the trench 60 is achieved.

In some embodiments, because parameters of the dimensions of the probe device 23, the DUT 6 and the reference region 7 are fixed, movement(s) for adjusting the relative position between the optical probe 233, the DUT 6 and the reference region 7 is (are) calculable. Accordingly, after the relative orientations between the optical probe 233 and the reference region 7 are adjusted, the relative position between the optical probe 233, the DUT 6 and the reference region 7 may be achieved based on the calculated movement(s).

Figure 2O:
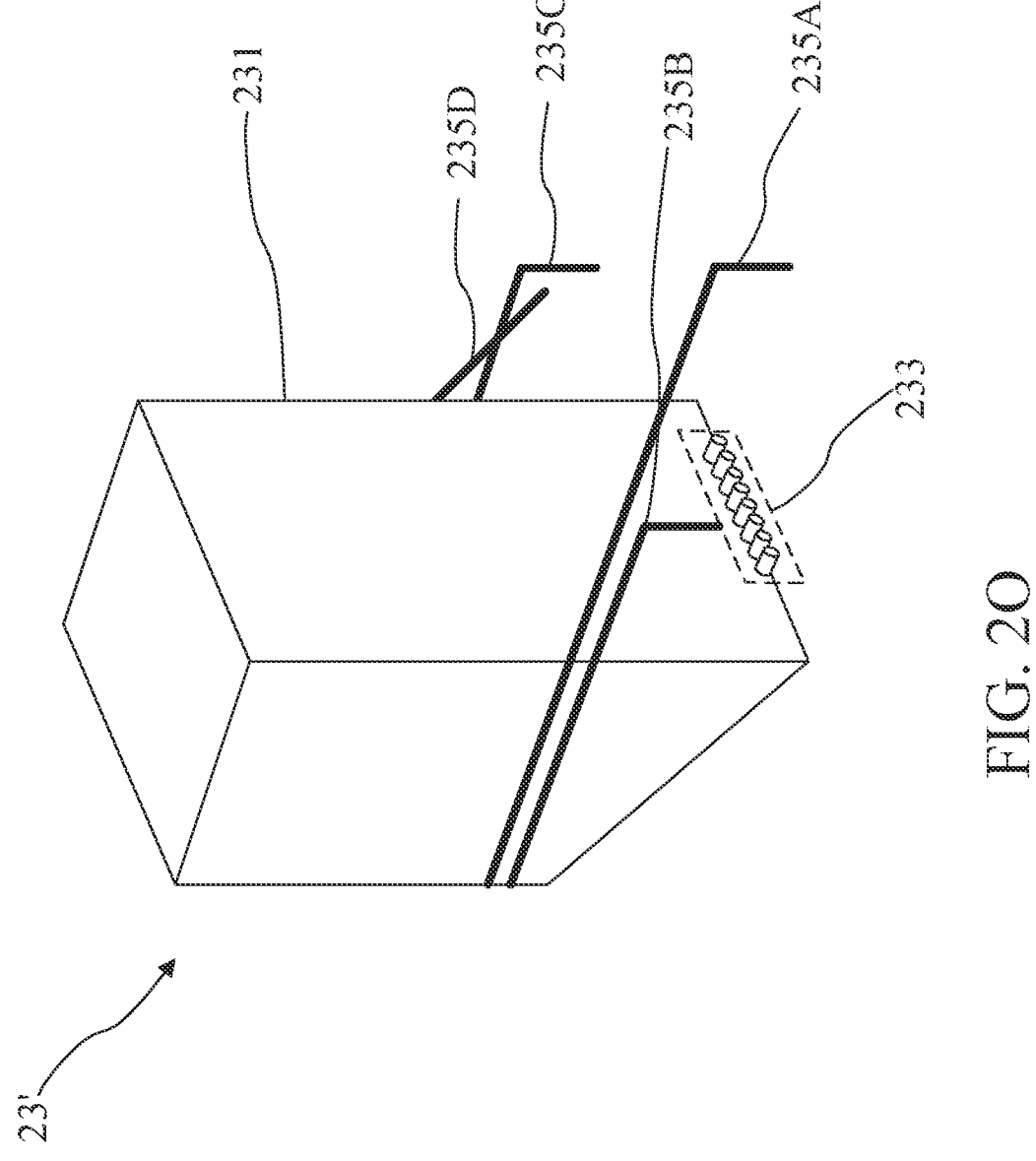
FIGS. 2O and 2P are schematic views of a probe device according to some embodiments of the disclosure.
Figure 2P:
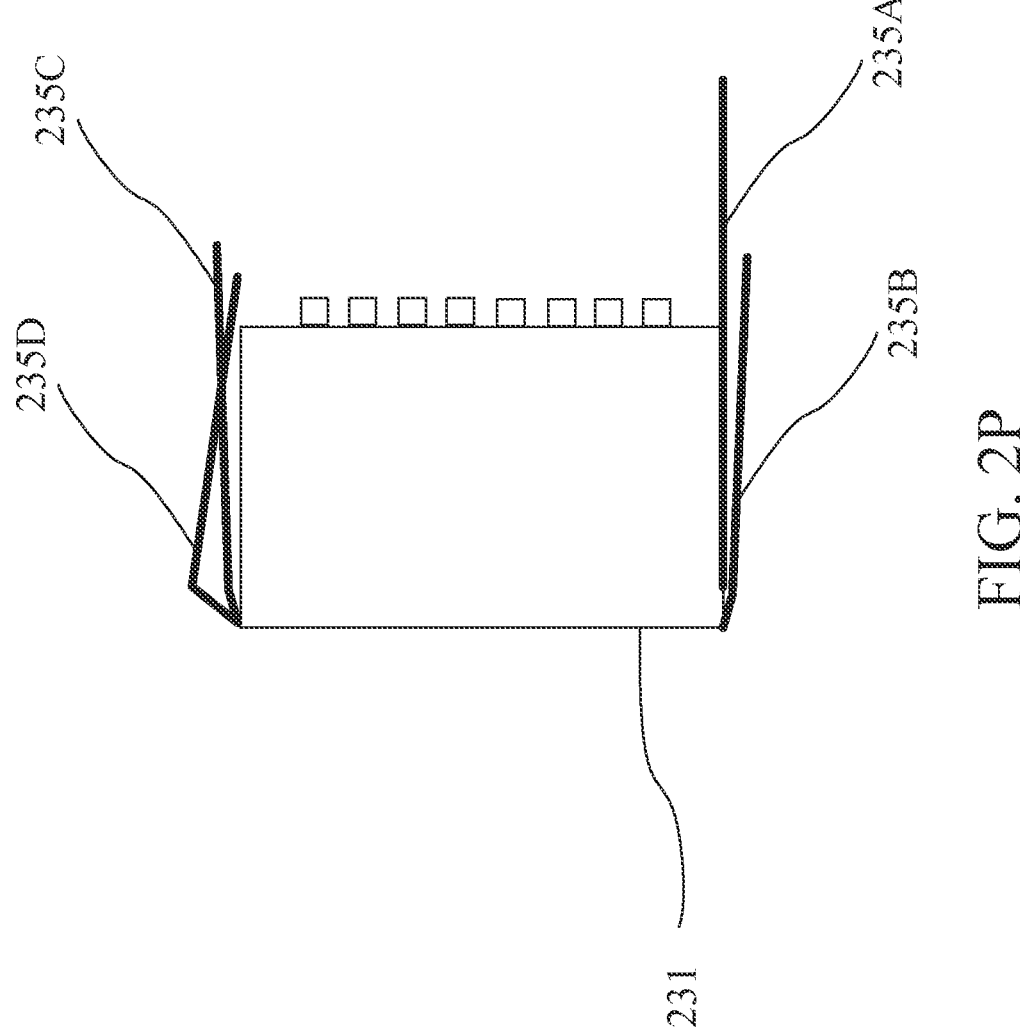

FIGS. 2O and 2P are schematic views of a probe device 23' according to some embodiments of the disclosure. In particular, the difference between the probe device 23 and the probe device 23' is that the sensing module 235 of the probe device 23' further includes a pin 235D. A circuit is between the pin 235D and one of the pins 235A to 235C, and whether the probe device 23' moves toward the DUT 6 depends on a status of the circuit is open or short.

In some embodiments, the additional pin 235D is below the pin 235C and is in contact with the pin 235C so that a status of the circuit between the additional pin 235D and the pin 235C is short. In particular, when the optical probe 233 is aligned with the trench 60 of the DUT 6, the body 231 is inserted into the trench 60 of the DUT 6 with a slow velocity.

During the movement of the probe device 23' (or the DUT 6), the status of the circuit between the pin 235D and the pin 235C is changed from short to open when: (1) the pin 235C touches the surface 62 of the DUT 6; and (2) the lift of the pin 235C causes the pin 235C being free from in contact with the pin 235D. Then, the probe device 23' stops moving (or the DUT 6 stops moving). Accordingly, the distance between the optical probe 233 and the bottom 602 of the trench may be kept safe to prevent damage.

In some embodiments, the pin 235D is above the pin 235C and is free from contacting the pin 235C so that the status of the circuit between the pin 235D and the pin 235C is open. In particular, when the optical probe 233 is aligned with the trench 60 of the DUT 6, the body 231 is inserted into the trench 60 of the DUT 6 with a slow velocity.

During the movement of the probe device 23' (or the DUT 6), the status of the circuit between the pin 235D and the pin 235C is changed from open to short when: (1) the pin 235C touches the surface 62 of the DUT 6; and (2) the lift of the pin 235C causes the pin 235C being in contact with the pin 235D. Then, the probe device 23' stops moving (or the DUT 6 stops moving). Accordingly, the distance between the optical probe 233 and the bottom 602 of the trench 60 may be kept safe to prevent damage.

It should be noted that, in some embodiments, the above scheme between the pin 235D and the pin 235C may be applied to the pin 235D and any pin of pins 235A, 235B.

Figure 3A:
FIG. 3A is a schematic view of a probe system according to some embodiments of the disclosure.
Figure 3C:
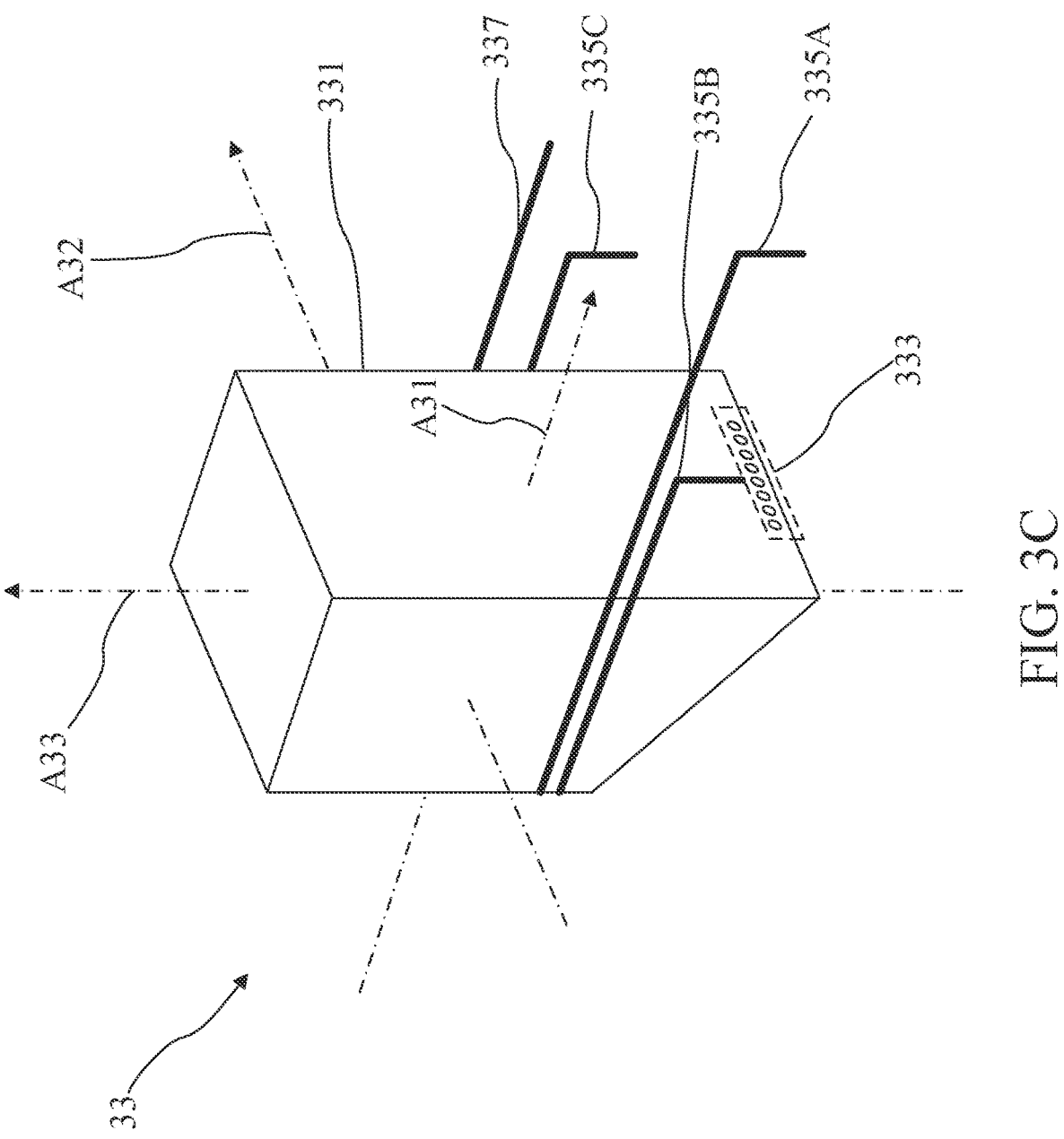
FIGS. 3C to 3H illustrate adjustment of the relative orientation between an optical probe and a reference region according to some embodiments of the disclosure.

FIG. 3A is a schematic view of a probe system 3. The probe system 3 includes a frame 31, a probe device 33 and a sensing module 335. The frame 31 and the probe device 33 are assembled. FIG. 3B is a schematic view of the probe device 3 according to some embodiments of the disclosure. The probe device 33 includes a body 331, an optical probe 333 and an alignment component 337. The optical probe 333 is disposed on the body 331.

In some embodiments, the optical probe 333 includes an optical FAB. In some embodiments, the sensing module 335 is disposed on the body 331 or disposed on the frame 31. The sensing module 335 includes at least one sensor for sensing contact with object. In some embodiments, the alignment component 337 is disposed on the body 331 or disposed on the frame 31.

In some embodiments, the optical probe 333 includes an optical FAB. The optical probe 333 is disposed on the body 331 and exposed on a sidewall 330 of the body 331. In some embodiments, the optical probe 333 is embedded in lower part of the body 331 and laterally exposed on the sidewall 330 of the body 331. In some embodiments, the sensing module 335 is disposed on the body 331 or disposed on the frame 31. The sensing module 335 includes at least one sensor for sensing contact with object.

FIGS. 3C to 3H illustrate adjustment of the relative orientation between the optical probe 333 and a reference region 5 according to some embodiments of the disclosure. In some embodiments, the sensing module 335 includes a first pin 335A, a second pin 335B and a third pin 335C. The first pin 335A and the second pin 335B are arranged along a direction of an axis A31 (e.g., an X axis in 3D space) and configured to detect a first relative orientation between the optical probe 333 and the reference region 5. The second pin 335B and the third pin 335C are arranged along a direction of an axis A32 (e.g., a Y axis in 3D space) and configured to detect a second relative orientation between the optical probe 333 and the reference region 5.

Figure 3D:
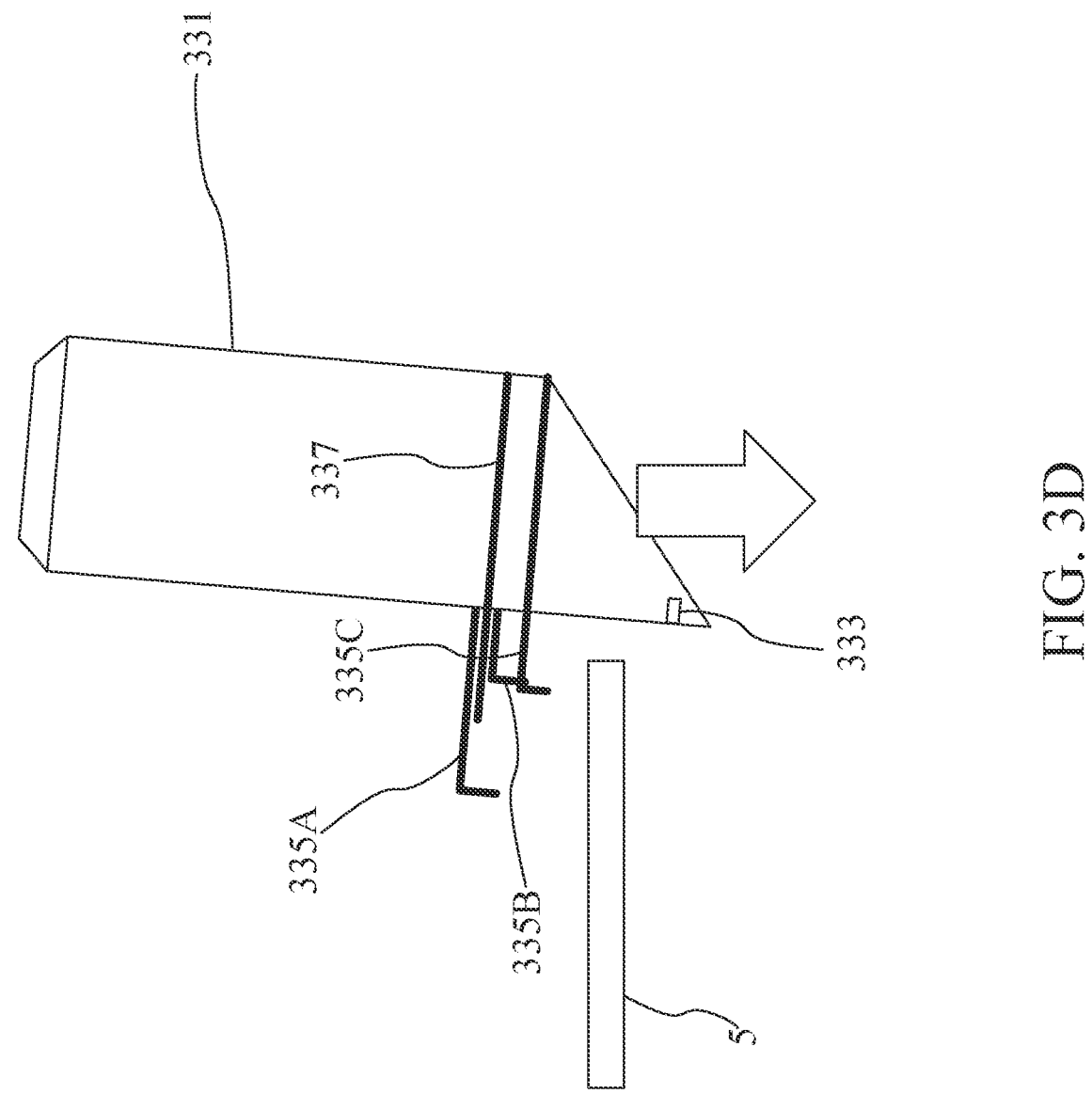
Figure 3E:
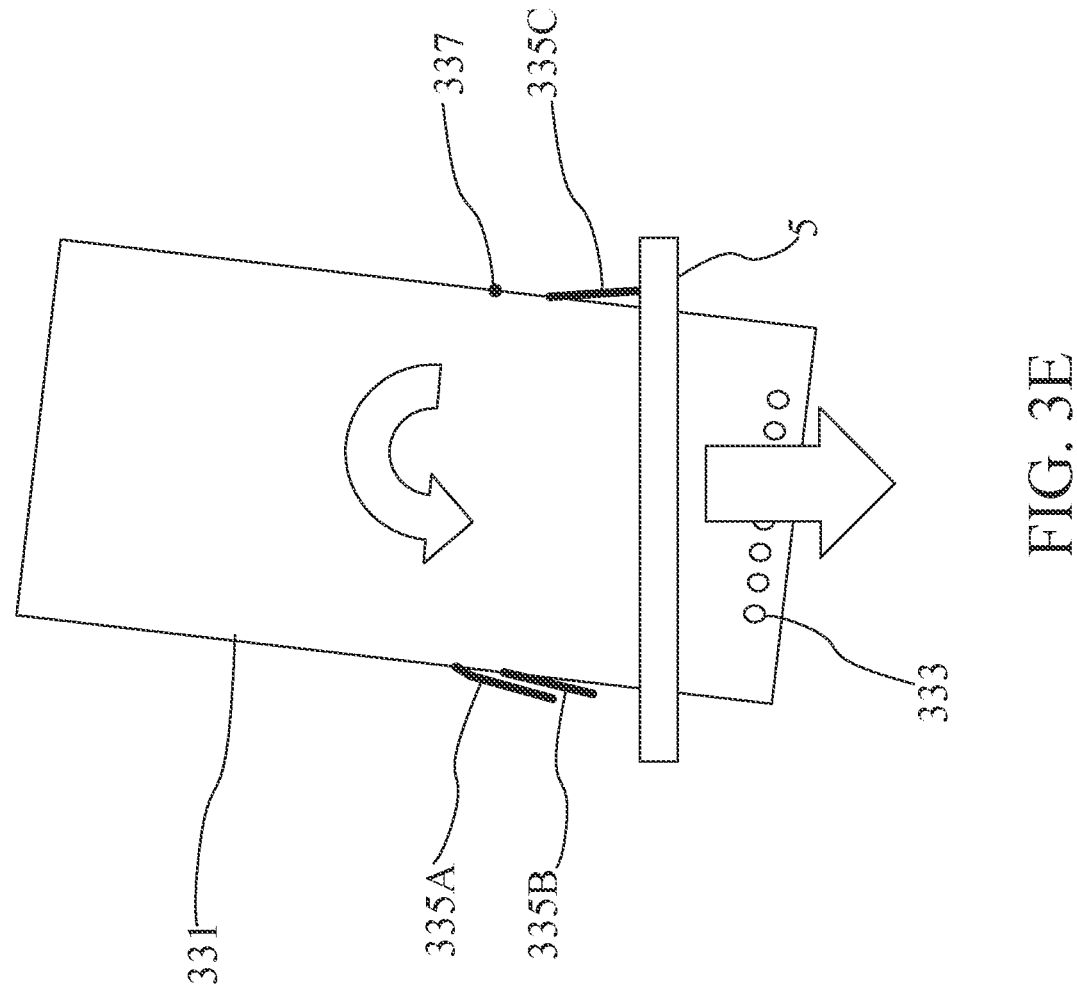
Figure 3F:
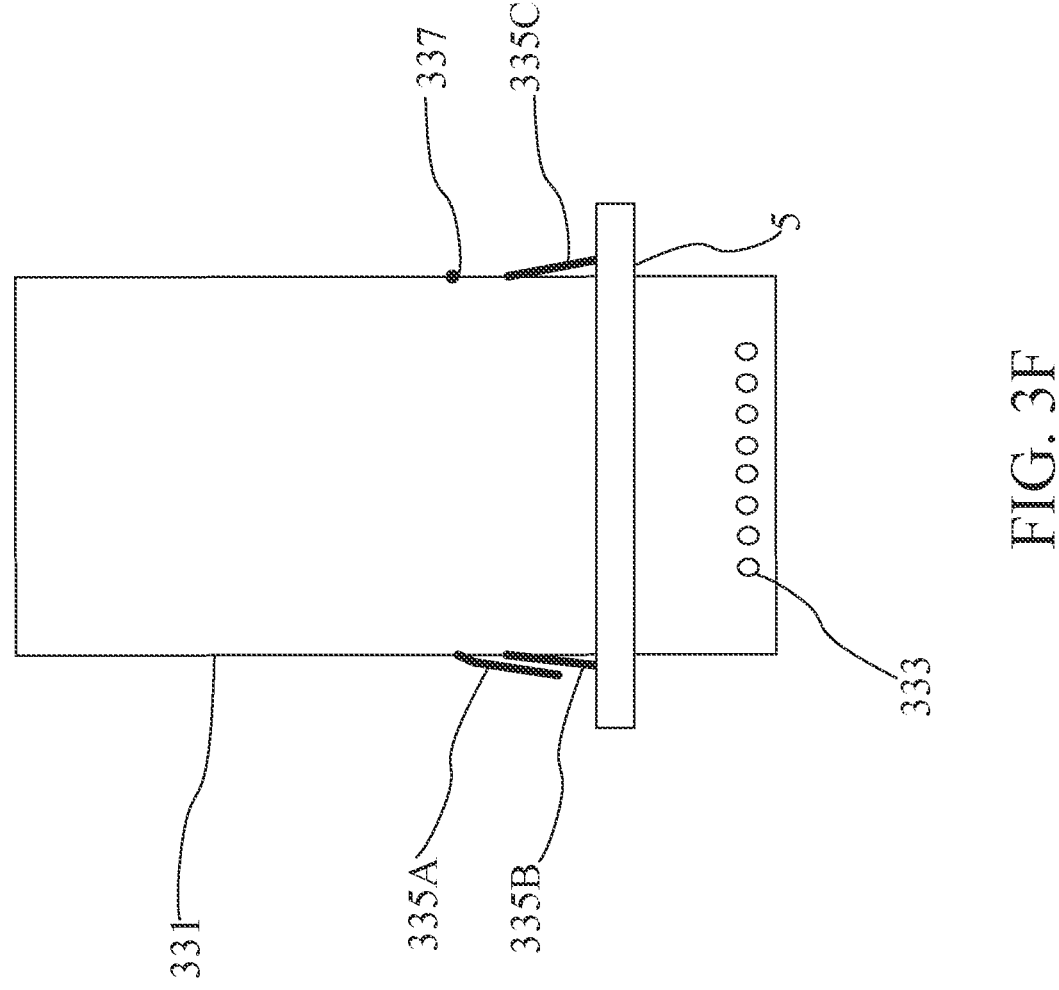
Figure 3G:
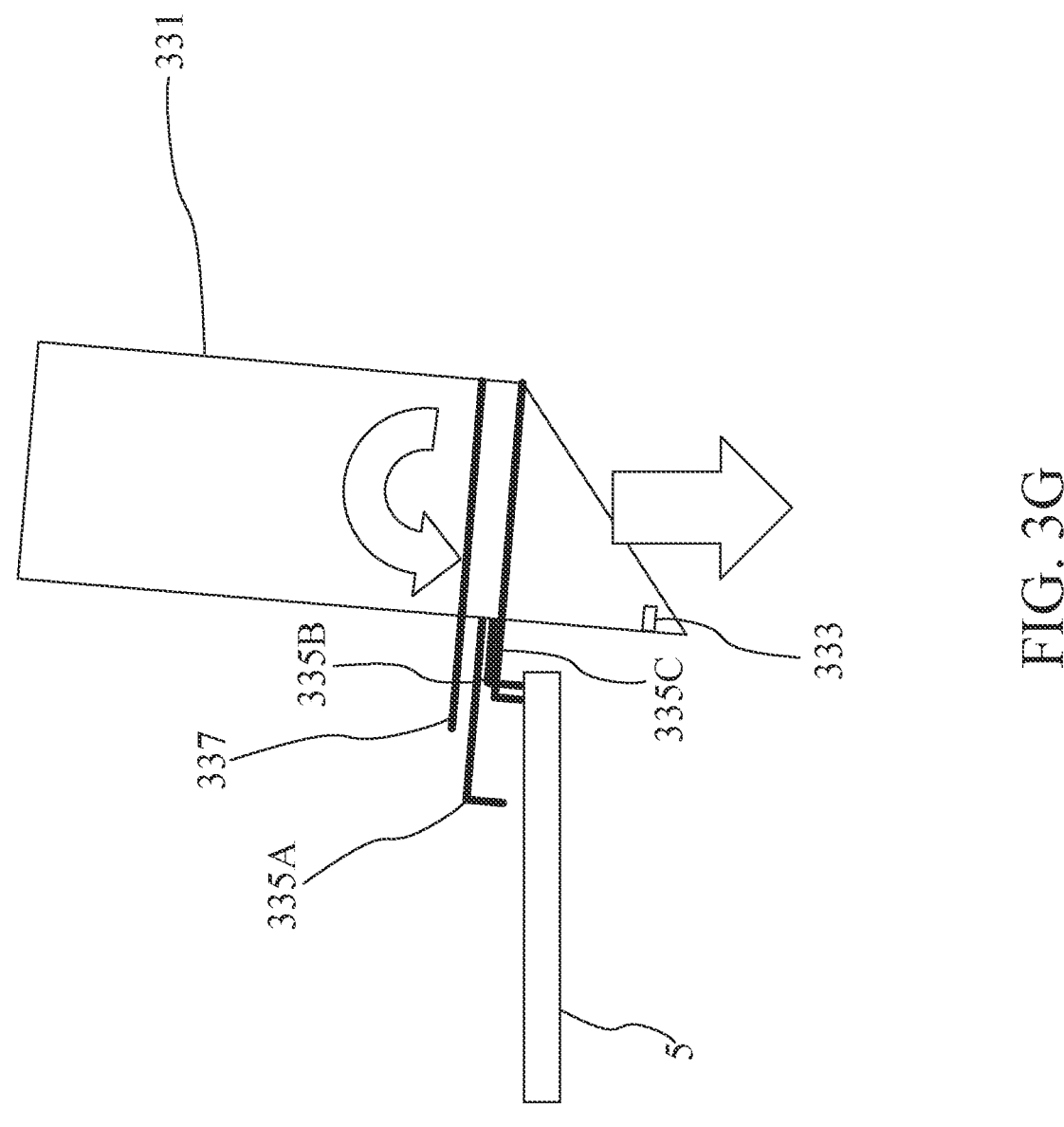
Figure 3H:
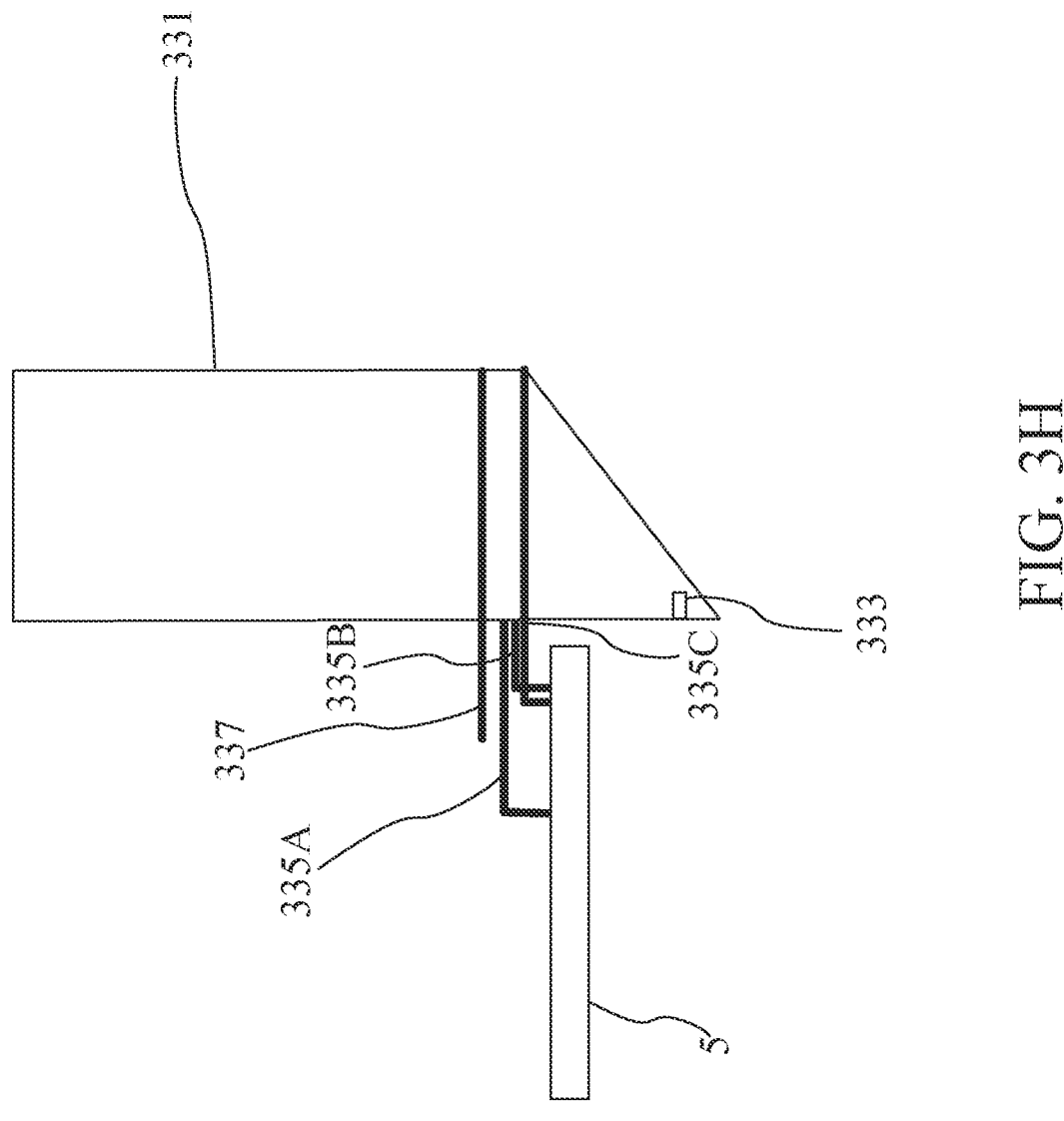

In some embodiments, the probe device 33 initially rotates about an axis A33 (e.g., a Z axis in 3D space) which is perpendicular to the axis A31 and the axis A32. As shown in FIG. 3D, the probe device 33 then approaches the reference region 5 along the third axis A33 until one of the pins (i.e., the pin 335C tin FIG. 3E) touches the reference region 5. As shown in FIGS. 3E and 3F, the probe device 33 then rotates about the axis A31 and keeps approaching the reference region 5 along the axis A33 until two of the pins (i.e., the pin 335C and the 335B in FIG. 3F) touch the reference region 5. As shown in FIGS. 3G and 3H, the probe device 33 rotates about the axis A32 and keeps approaching the reference region 5 along the axis A33 until three pins (i.e., the pin 335A, the pin 335B and the pin 335C in FIG. 3H touch the reference region 5. Accordingly, the relative orientations between the optical probe 333 of the probe device 33 and the reference region 5 are adjusted.

Figure 3I:
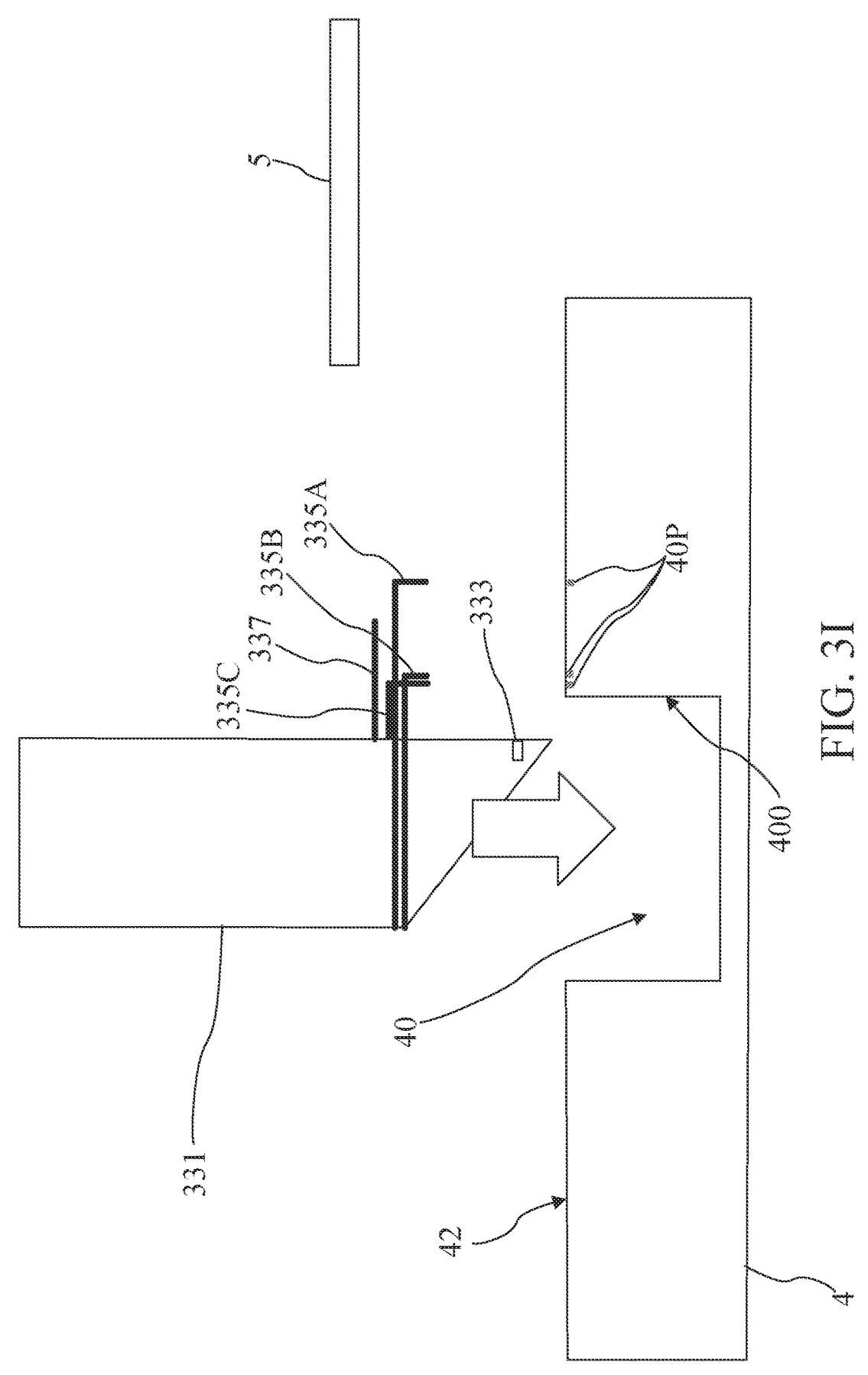
FIGS. 3I and 3J illustrate the relative movement between the probe device and a DUT according to some embodiments of the disclosure.
Figure 3J:
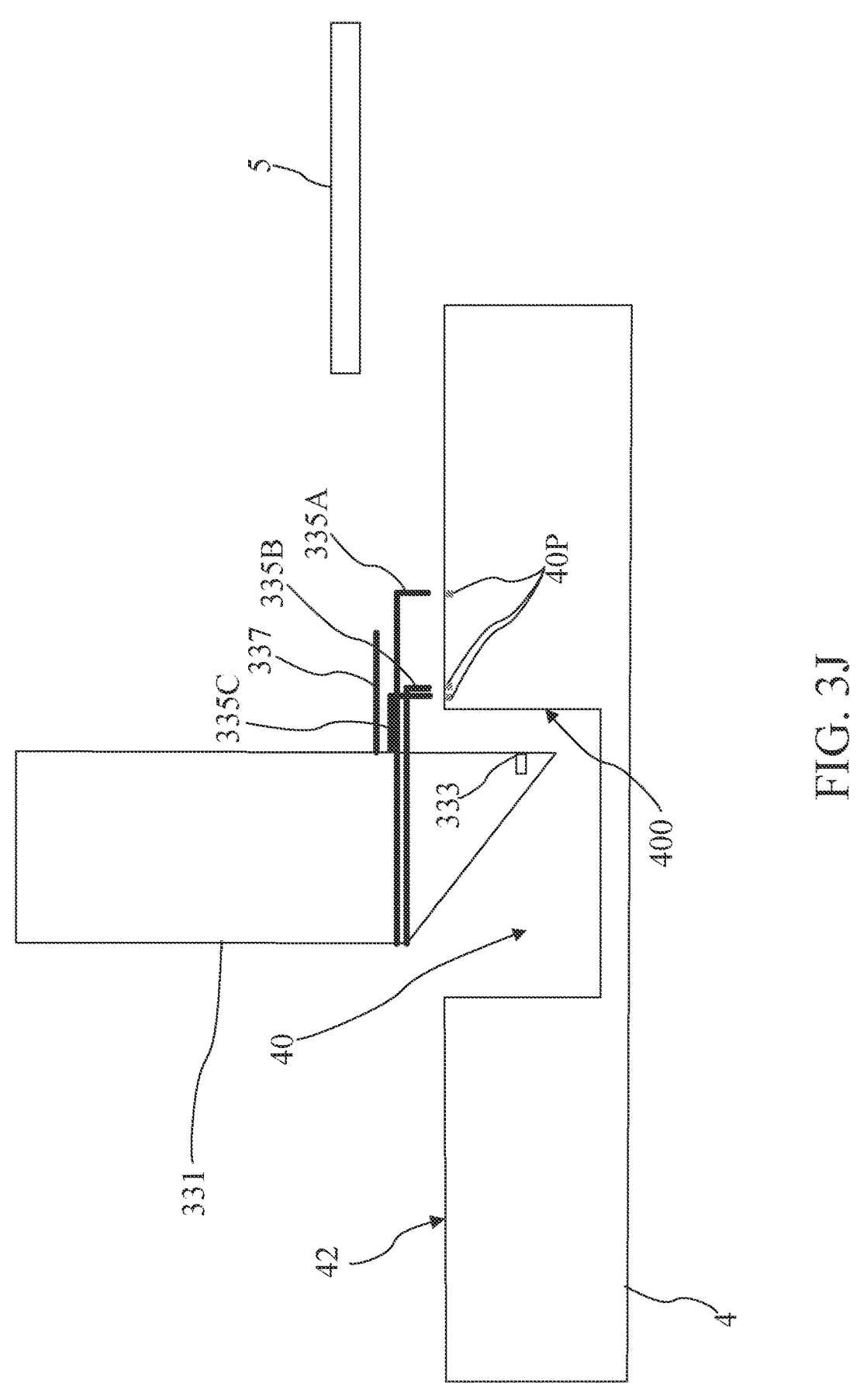
Figure 3K:
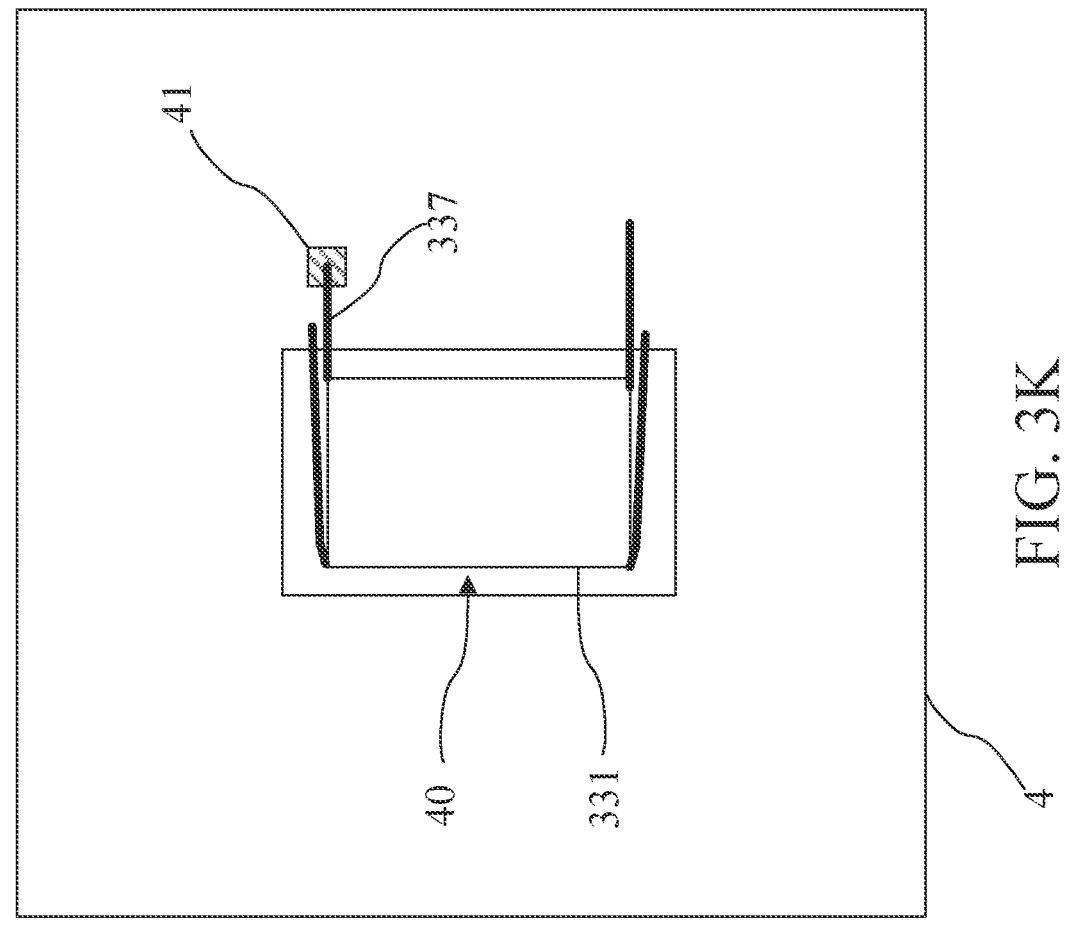
FIG. 3K illustrates alignment between the alignment component of the probe device and the mark of the DUT.

In some embodiments, as shown in FIGS. 3I and 3J, by moving the probe device 33 or moving a DUT 4 which is parallel with the reference region 5, the body 331 is aligned with a trench 40 of the DUT 4. In particular, as shown in FIG. 3K, the body 331 is aligned with the trench 40 of the DUT 4 by aligning the alignment component 337 with a mark 41 of the DUT 4.

Then, the body 331 is inserted into the trench 40 to align the optical probe 333 to a light transmission device (not shown) exposed on a sidewall 400 of the trench 40. In particular, because the reference region 5 is parallel with a surface 42 of the DUT 4, the adjustment for the relative orientations between the optical probe 333 and the reference region 5 may be applied to the relative orientations between the optical probe 333 and the surface 42 of the DUT 4 as well. Accordingly, the adjustment for the relative orientations between the optical probe 333 and the reference region 5 may be applied to the relative orientations between the optical probe 333 and the sidewall 400 of the trench 40 so that an optical path between the optical probed 333 and the light transmission device exposed on the sidewall 400 of the trench 40 is corrected. In some embodiments, the reference region can be: (1) an auxiliary chuck; or (2) a testkey of scribe line of the DUT 4.

Figure 3L:
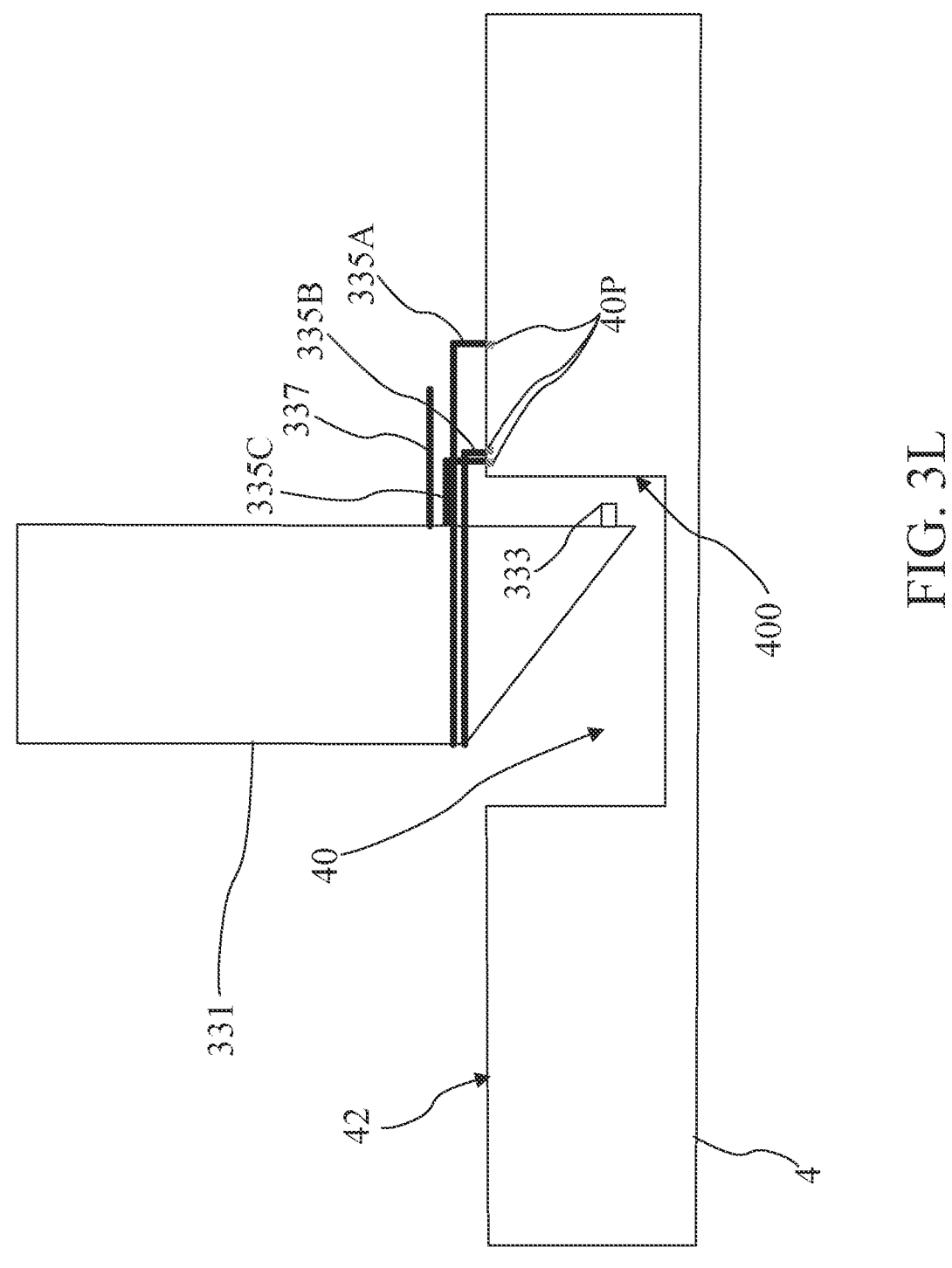
FIGS. 3L to 3N illustrate adjustment of the relative position between the optical probe and the DUT according to some embodiments of the disclosure.
Figure 3M:
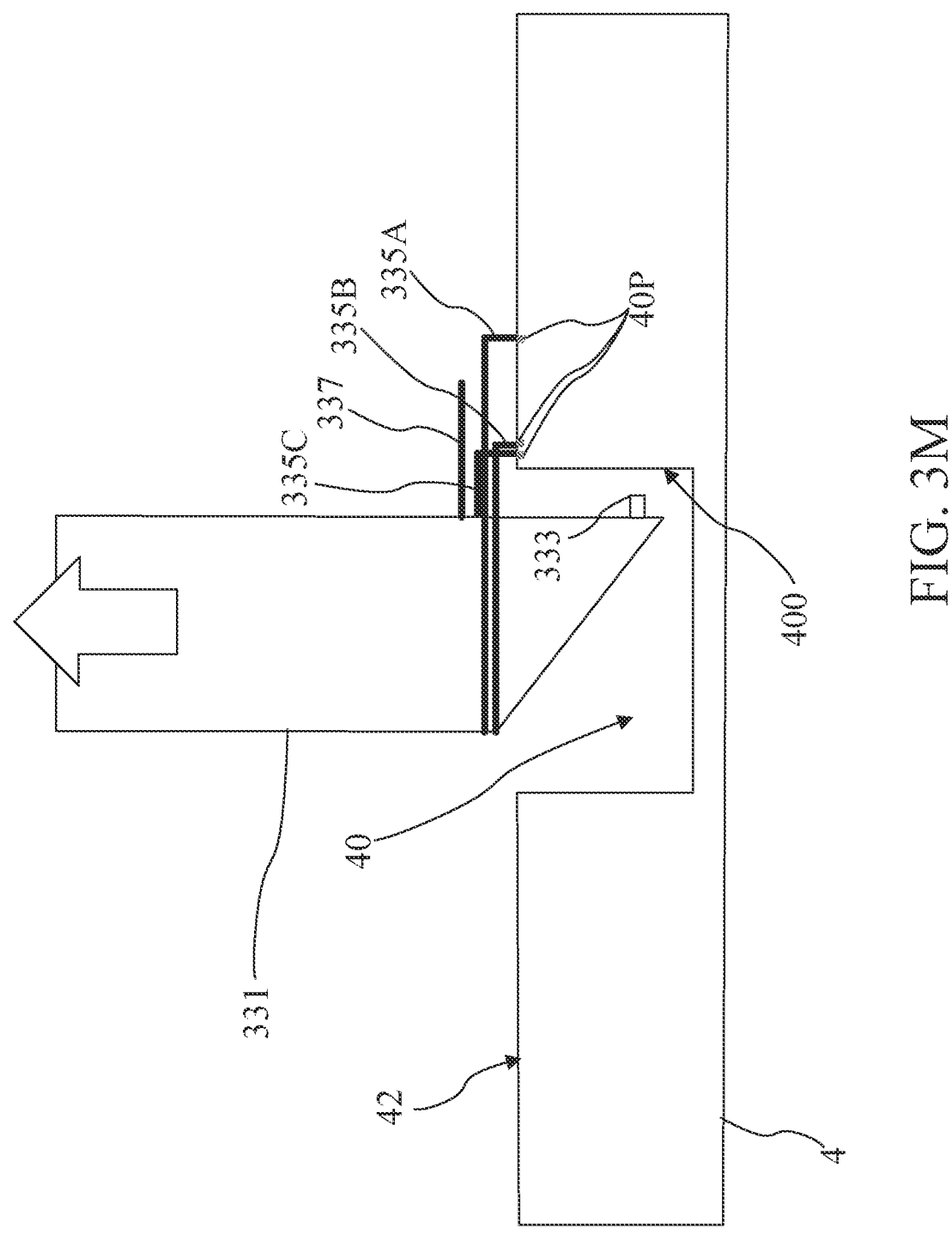
Figure 3N:
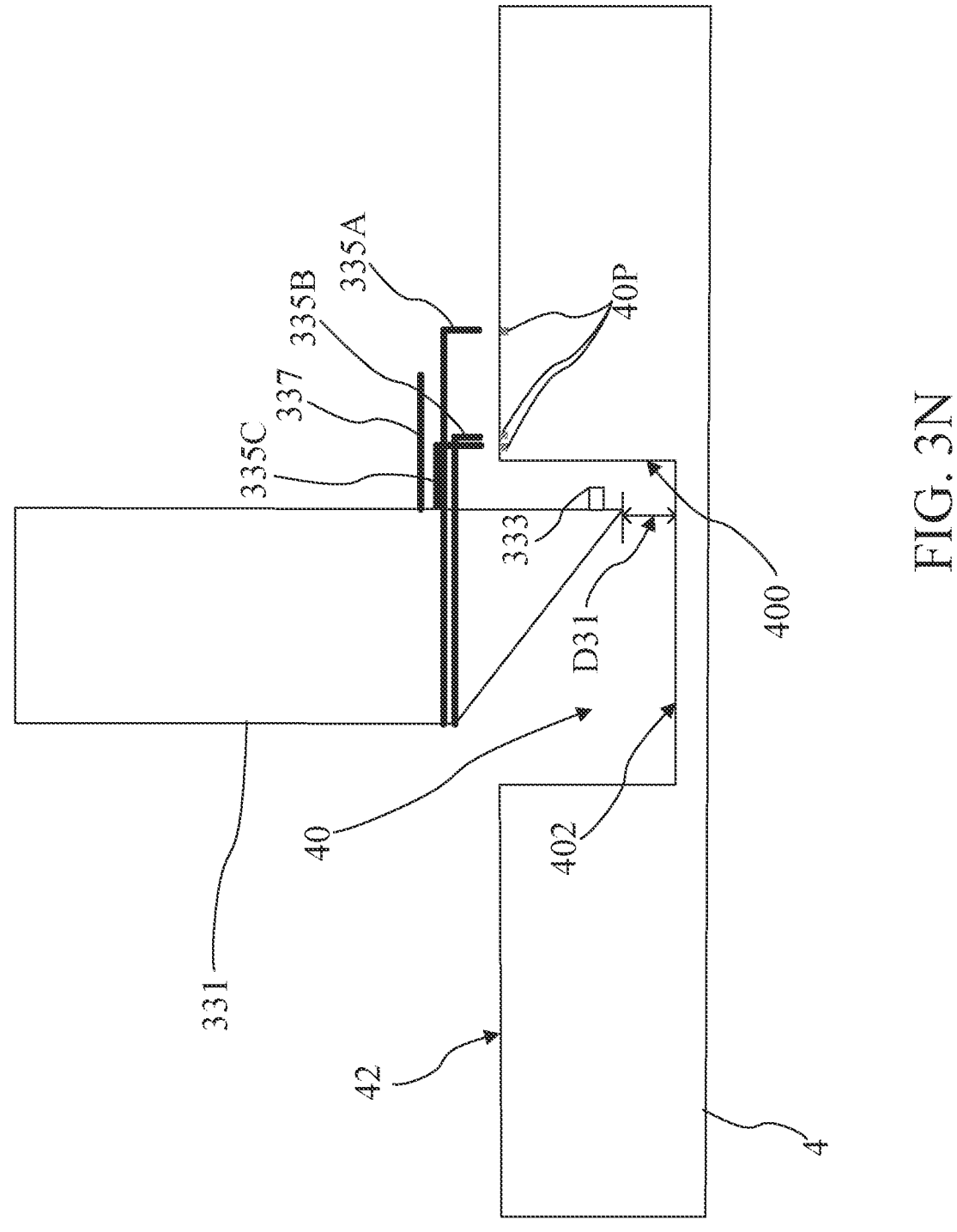
Figure 30:
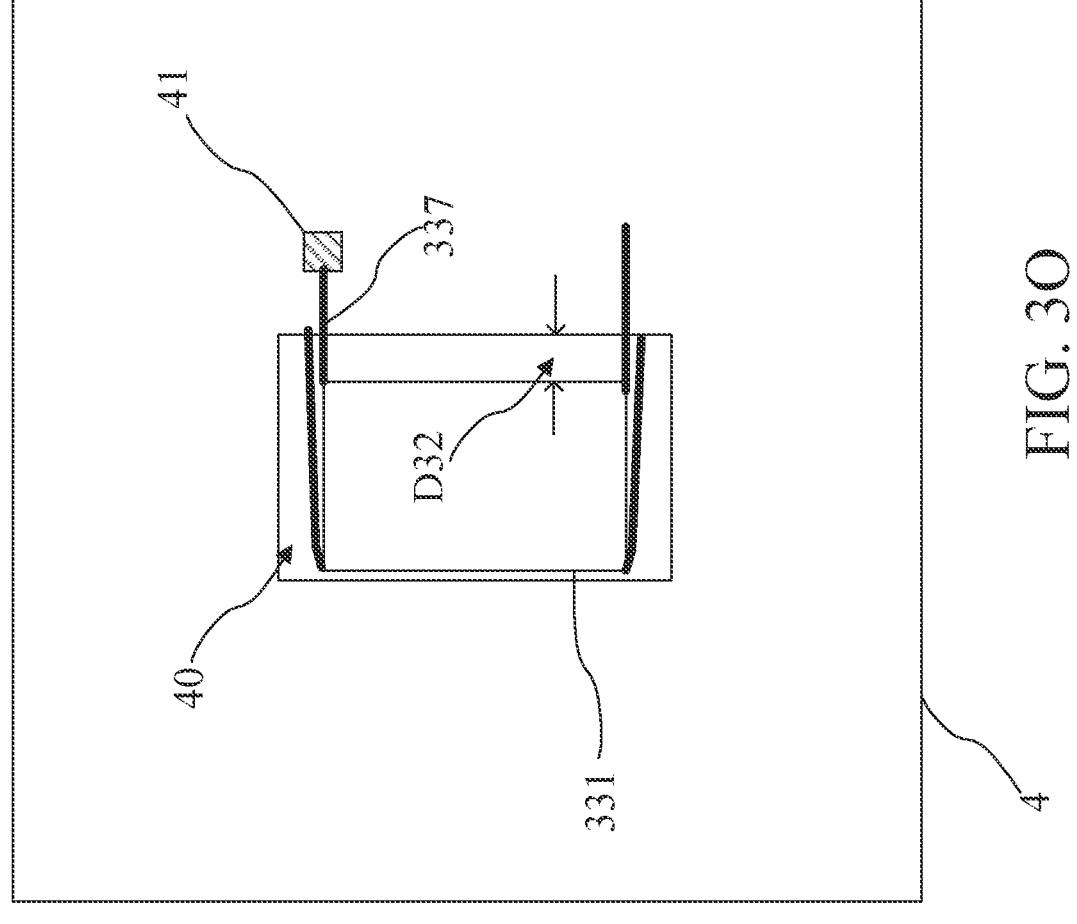

FIGS. 3L to 3N illustrate adjustment of the relative position between the optical probe 333 and the DUT 4 according to some embodiments of the disclosure. In some embodiments, after inserting the probe device 33 into the trench 40 of the DUT 4, at least one of the pins 335A to 335C touches at least one locating point 40P on the surface 42 of the DUT 4 for initialing the adjustment procedure. Specifically, in these embodiments, to align the optical probe 333 with the light transmission device exposed on the sidewall 400, the probe device 33 or the DUT 4 is moved until the pins 335A to 335C touch the corresponding locating points 40P on the surface 42. When the pins 335A to 335C touch the locating points 40P on the surface 42, the probe device 33 is moved away from the surface 42 of the DUT 4 for a distance so that the optical probe 333 is a desired distance D31 away from a bottom 402 of the trench 40.

In some embodiments, the probe device 3 may be optionally moved toward to or away from the surface 42 of the DUT 4 (or the DUT 4 may be optionally moved toward to or away from the probe device 33) for a distance so that the optical probe 333 is another desired distance away from the bottom 402 of the trench 40.

FIG. 3O illustrates adjustment of the relative position between the optical probe 333 and the DUT 4 according to some embodiments of the disclosure. In some embodiments, a distance between the optical probe 333 and the sidewall 400 of the trench 40 may be adjusted by top view images. In particular, top view images of the probe device 33 and the DUT 4 are captured. Based on image processing technologies, relative position between the alignment component 337 and the mark 41 of the DUT 4 may be recognized. Further, because parameters of the dimensions of the elements (e.g., the body 331, the optical probe 333 and the alignment component 337) of the probe device 33 and the element (e.g., the trench 40) of the DUT 4 are fixed, a relative position between the optical probe 333 (which is embedded in the body 331 as shown in the figures) and the trench 40 may be determined. Accordingly, the relative position between the alignment component 337 and the mark 41 of the DUT 4 may be adjusted by moving the DUT 4 or moving the probe device 33 until the relative position (e.g., a desired distance D32) between the optical probe 333 and the sidewall 400 of the trench 40 is achieved. It should be noted that there may not be any physically contact between the alignment component 337 and the mark 41.

In some embodiments, because parameters of the dimensions of the probe device 33, the DUT 4 and the reference region 5 are fixed, movement(s) for adjusting the relative position between the optical probe 333, the DUT 4 and the reference region 5 is (are) calculable. Accordingly, after the relative orientations between the optical probe 333 and the reference region 5 are adjusted, the relative position between the optical probe 333, the DUT 4 and the reference region 5 may be achieved based on the calculated movement(s).

Figure 4:
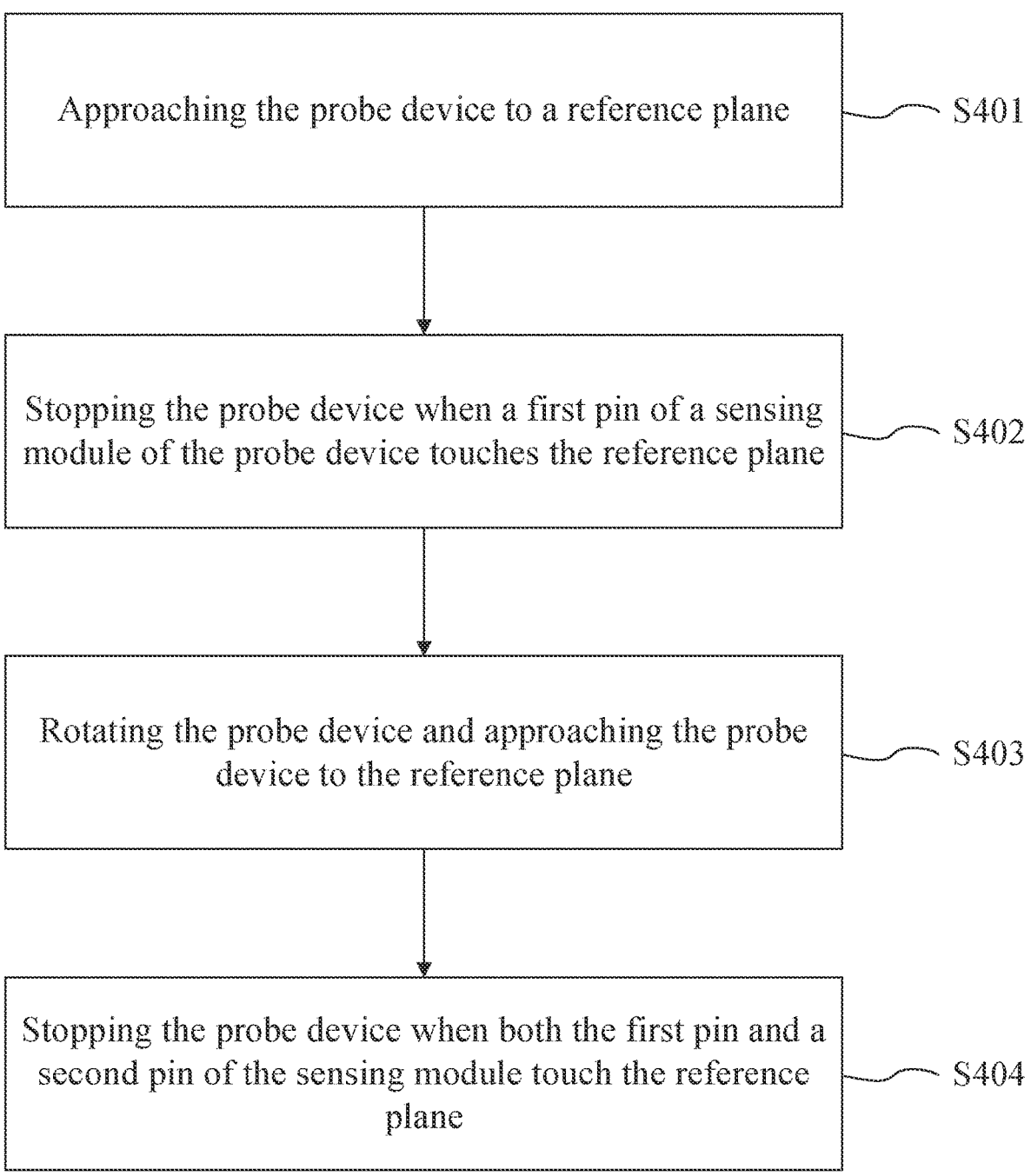
FIG. 4 is flowchart diagram of a method for operating a probe device according to some embodiments of the disclosure.

Some embodiments of the present disclosure include a method of operating a probe device or a probe system including the probe device (e.g., the probe devices and the probe systems of the aforesaid embodiments), and flowchart diagram thereof is as shown in FIG. 4. Detail of the operating method are as follows.

Step S401 is performed to approach the probe device to a reference region. Step S402 is performed to stop the probe device when a first pin of a sensing module of the probe device touches the reference region. Step S403 is performed to rotate the probe device and approach the probe device to the reference region. Step S404 is performed to stop the probe device when both the first pin and a second pin of the sensing module of the probe device touch the reference region. Accordingly, the relative orientation between the probe device and the reference region is adjusted.

Some embodiments of the present disclosure include a method of operating a probe device or a probe system including the probe device (e.g., the probe devices and the probe systems of the aforesaid embodiments), and flowchart diagrams thereof are as shown in FIGS. 5A to 5C. Detail of the operating method are as follows.

Step S501 is performed to approach the probe device to a reference region along a direction of a first axis (e.g., a Z axis in 3D space). Step S502 is performed to stop the probe device when a first pin of a sensing module of the probe device touches the reference region. Step S503 is performed to rotate the probe device about a second axis (e.g., an X axis in 3D space) and approach the probe device to the reference region along the direction of the first axis. Step S504 is performed to stop the probe device when both the first pin and a second pin of the sensing module of the probe device touch the reference region.

Step S505 is performed to rotate the probe device about a third axis (e.g., a Y axis in 3D space) and approach the probe device to the reference region along the direction of the first axis. Step S506 is performed to stop probe device when the first pin, the second pin and a third pin of the sensing module of the probe device touch the reference region. Accordingly, the relative orientation between the probe device and the reference region is adjusted.

In some embodiment, step S507 may be optionally performed. Step S507 is performed to move the probe device to align an optical probe of the probe device with a DUT which is parallel to the reference region. In some embodiment, steps S508 and S509 may be optionally performed. S508 is performed to move the probe device toward the DUT. Step S509 is performed to stop the probe device when a status of a circuit of the probe device is changed from open or short. The circuit is between a fourth pin of the sensing module and one of the first pin, the second pin and the third pin.

According to the disclosure, the probe device and the probe system including the probe device may be control automatically by external components, such as computing device (for controlling purpose), motors (for movement and rotation of the probe device), etc. Therefore, the alignment between the optical probe of the probe device and the light transmission device of the DUT can be precisely controlled and the results of testing are more accurate.

Although the disclosure and advantages thereof are described above, persons skilled in the art understand that various changes, replacements and substitutions may be made to the disclosure without departing from the spirit and scope defined in the appended claims of the disclosure. For instance, the aforesaid processes may be implemented with different methods and replaced with any other processes or a combination thereof.

The scope of the disclosure is not restricted to specific embodiments of any processes, machines, manufacturing, matter compositions, means, methods and steps described herein. The disclosure described herein enables persons skilled in the art to implement the disclosure with any existing or potential processes, machines, manufacturing, matter compositions, means, methods or steps having the same function or capable of achieving substantially the same result as disclosed in the aforesaid embodiments. Therefore, these processes, machines, manufacturing, matter compositions, means, methods and steps fall within the scope of the appended claims of the disclosure.

What is claimed is:

1. A probe device, comprising:
   a body;
   an optical probe disposed on the body; and
   a sensing module disposed on the body, comprising at least a first pin, a second pin, and a third pin to adjust two relative orientations between the optical probe and a reference region,
   wherein the first pin and the second pin are configured to adjust a first relative orientation of the two relative orientations,
   wherein the second pin and the third pin are configured to adjust a second relative orientation of the two relative orientations.

2. The probe device of claim 1, wherein the first pin and the second are arranged along a first axis.

3. The probe device of claim 2, wherein the first pin and the second pin are configured to adjust the first relative orientation by:
   rotating the probe device until both the first pin and the second pin touch the reference region.

4. The probe device of claim 2, wherein the second pin and the third pin are arranged along a second axis which is perpendicular to the first axis.

5. The probe device of claim 4, wherein the second pin and the third pin are configured to adjust the second relative orientation by:
   rotating the probe device until both the second pin and the third pin touch the reference region.

6. The probe device of claim 1, wherein the sensing module further comprise a fourth pin, a circuit is between the fourth pin and one of the first pin, the second pin and the third pin, and whether the probe device moves toward a DUT depends on a status of the circuit is open or short.

7. The probe device of claim 1, wherein the optical probe includes a fiber array block.

8. The probe device of claim 1, wherein the reference region is an auxiliary chuck or a testkey of scribe line of a device under test.

9. A probe system, comprising:
   a frame;
   a probe device, assembled with the frame and comprising:
   a body; and
   an optical probe disposed on the body; and
   a sensing module disposed on the body or the frame, comprising at least a first pin, a second pin, and a third pin to adjust two relative orientations between the optical probe and a reference region,
   wherein the first pin and the second pin are configured to adjust a first relative orientation of the two relative orientations,
   wherein the second pin and the third pin are configured to adjust a second relative orientation of the two relative orientations.

* * * * *